United States Patent
Fan et al.

(10) Patent No.: US 10,073,738 B2
(45) Date of Patent: Sep. 11, 2018

(54) XF ERASURE CODE FOR DISTRIBUTED STORAGE SYSTEMS

(71) Applicant: Samsung Electronics Co., Ltd, Suwon-si (KR)

(72) Inventors: Xiaoqing Fan, Ithaca, NY (US); Eran Pisek, Plano, TX (US); Shadi Abu-Surra, Plano, TX (US)

(73) Assignee: Samsung Electronics Co., Ltd., Suwon-Si (KR)

( * ) Notice: Subject to any disclaimer, the term of this patent is extended or adjusted under 35 U.S.C. 154(b) by 18 days.

(21) Appl. No.: 15/017,389

(22) Filed: Feb. 5, 2016

(65) Prior Publication Data
US 2017/0046227 A1    Feb. 16, 2017

Related U.S. Application Data

(60) Provisional application No. 62/205,504, filed on Aug. 14, 2015.

(51) Int. Cl.
| | |
|---|---|
| *G06F 11/10* | (2006.01) |
| *H03M 13/15* | (2006.01) |
| *H04L 29/08* | (2006.01) |

(52) U.S. Cl.
CPC ..... *G06F 11/1088* (2013.01); *H03M 13/1515* (2013.01); *H03M 13/154* (2013.01); *H04L 67/1097* (2013.01)

(58) Field of Classification Search
CPC .............. G06F 11/1088; H03M 13/154; H04L 67/1097
See application file for complete search history.

(56) References Cited

U.S. PATENT DOCUMENTS

| | | | |
|---|---|---|---|
| 2003/0065989 A1 | 4/2003 | Yedida et al. | |
| 2005/0022046 A1* | 1/2005 | Cheng ................. | H04L 1/0041 |
| | | | 714/4.2 |

(Continued)

FOREIGN PATENT DOCUMENTS

KR    10-1441059 B1    9/2014

OTHER PUBLICATIONS

Dimitris S. Papailiopoulos et al., "Repair Optimal Erasure Codes through Hadamard Designs," arXiv:1106.1634v1 [cs.IT], Jun. 8, 2011, 20 pages, available at http://arxiv.org/pdf/1106.1634.pdf.

(Continued)

*Primary Examiner* — Kyle Vallecillo

(57) ABSTRACT

An encoding apparatus includes a processor and a communication interface operably coupled to a distributed storage system (DSS) that includes n storage device nodes. The processor is coupled to the communication interface, and configured to encode the nodes according to an XF erasure code by: dividing a number of symbols of original data into k data packets; selecting k of the storage device nodes to store the k data packets and n−k other storage device nodes to store parity packets; outputting the k data packets to the k selected storage device nodes; obtaining an XF code generator matrix; generating n−k parity packets according to a function of the k data packets and the XF code generator matrix; and outputting the n−k parity packets to each of the n−k other storage device nodes.

20 Claims, 12 Drawing Sheets

(56) References Cited

U.S. PATENT DOCUMENTS

| | | | |
|---|---|---|---|
| 2012/0173932 A1* | 7/2012 | Li | G06F 11/1076 |
| | | | 714/42 |
| 2014/0181579 A1 | 6/2014 | Whitehead et al. | |
| 2015/0142863 A1* | 5/2015 | Yuen | H03M 13/13 |
| | | | 707/827 |
| 2016/0105202 A1* | 4/2016 | Tosato | H03M 13/373 |
| | | | 714/776 |

OTHER PUBLICATIONS

International Search Report, International Application No. PCT/KR2016/008192, dated Oct. 26, 2016, 3 pages, International Application Division Korean Intellectual Property Office, Daejeon, Republic of Korea.

International Searching Authority, "Written Opinion of the International Searching Authority," International Application No. PCT/KR2016/008192, dated Oct. 26, 2016, 6 pages, International Application Division Korean Intellectual Property Office, Daejeon, Republic of Korea.

Dimakis, Alexandros G., et al. "Network coding for distributed storage systems." Information Theory, IEEE Transactions on 56.9 (2010): 4539-4551.

Suh, Changho, and Kannan Ramchandran. "Exact-repair MDS codes for distributed storage using interference alignment." Information Theory Proceedings (ISIT), 2010 IEEE International Symposium on. IEEE, 2010.

Suh, Changho, and Kannan Ramchandran. "On the existence of optimal exact-repair MDS codes for distributed storage." arXiv preprint arXiv:1004.4663 (2010). 20 pages.

Rashmi, K. V., et al. "A hitchhiker's guide to fast and efficient data reconstruction in erasure-coded data centers." Proceedings of the 2014 ACM conference on SIGCOMM. ACM, 2014. 12 Pages.

\* cited by examiner

XF ERASURE CODE FOR DISTRIBUTED STORAGE SYSTEMS

CROSS-REFERENCE TO RELATED APPLICATION(S) AND CLAIM OF PRIORITY

This application claims priority under 35 U.S.C. § 119(e) to U.S. Provisional Patent Application No. 62/205,504 filed on Aug. 14, 2015. The above-identified provisional patent application is hereby incorporated by reference in its entirety.

TECHNICAL FIELD

This disclosure relates generally to erasure coding. More specifically, this disclosure relates to XF erasure code for distributed storage systems.

BACKGROUND

Erasure codes such as Reed-Solomon (RS) codes are used in distributed storage systems (DSS) because the RS codes provide the same level of reliability as data replication methods, yet the RS codes provide much lower storage overheads than the data replication methods. Compared to the data replication methods, these RS codes require much higher network bandwidth and disk input/output (I/O) during reconstruction of one failure node.

SUMMARY

This disclosure provides systems and methods for implementing XF erasure code for distributed storage systems.

In a first embodiment, an apparatus includes a processor and a communication interface operably coupled to a distributed storage system (DSS). The DSS includes n nodes encoded according to an XF erasure code. The n nodes include k data nodes, and n–k parity nodes. Each data node in the DSS stores a data packet, and each parity node in the DSS stores a parity packet. The processor is coupled to the communication interface. The processor is configured to repair a single failed node in the DSS by: dividing the n nodes into a number of groups based on a packet type of the single failed node. The processor is configured to repair a single failed node in the DSS by: upon determining that the single failed node includes a data packet, receiving, from the DSS, a collection of data including: n–k symbols of the data packet from each available data node in a same group as the single failed node, and one symbol of the packet from each available node nodes in a different group than the single failed node. The processor is configured to repair a single failed node in the DSS by: reconstructing the single failed node using the collection of data and an XF code generator matrix.

In a second embodiment, a method includes: repairing, by a processor, a single failed node in a distributed storage system (DSS) that includes n nodes encoded according to an XF erasure code. In the DSS, the n nodes include k data nodes and n–k parity nodes. Each data node in the DSS stores a data packet, and each parity node in the DSS stores a parity packet. The repairing, by the process, the single failed node in the DSS includes: dividing the n nodes into a number of groups based on a packet type of the single failed node. The repairing, by the process, the single failed node in the DSS includes: upon determining that the single failed node includes a data packet, receiving, from the DSS, a collection of data including: n–k symbols of the data packet from each available data node in a same group as the single failed node, and one symbol of the packet from each available node nodes in a different group than the single failed node. The repairing, by the process, the single failed node in the DSS includes: reconstructing the single failed node using the collection of data and an XF code generator matrix.

In a third embodiment, an encoding apparatus includes a processor and a communication interface operably coupled to a distributed storage system (DSS) that includes n storage device nodes. The processor is coupled to the communication interface, and configured to encode the nodes according to an XF erasure code by: dividing a number of symbols of original data into k data packets. The processor is configured to encode the nodes according to an XF erasure code by: selecting k of the storage device nodes to store the k data packets and n–k other storage device nodes to store parity packets. The processor is configured to encode the nodes according to an XF erasure code by: outputting the k data packets to the k selected storage device nodes. The processor is configured to encode the nodes according to an XF erasure code by: obtaining an XF code generator matrix. The processor is configured to encode the nodes according to an XF erasure code by: generating n–k parity packets according to a function of the k data packets and the XF code generator matrix; and outputting the n–k parity packets to each of the n–k other storage device nodes.

Other technical features may be readily apparent to one skilled in the art from the following figures, descriptions, and claims.

Before undertaking the DETAILED DESCRIPTION below, it may be advantageous to set forth definitions of certain words and phrases used throughout this patent document. The term "couple" and its derivatives refer to any direct or indirect communication between two or more elements, whether or not those elements are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The term "controller" means any device, system or part thereof that controls at least one operation. Such a controller may be implemented in hardware or a combination of hardware and software and/or firmware. The functionality associated with any particular controller may be centralized or distributed, whether locally or remotely. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for other certain words and phrases are provided throughout this patent document. Those of ordinary skill in the art should understand that in many if not most instances, such definitions apply to prior as well as future uses of such defined words and phrases.

BRIEF DESCRIPTION OF THE DRAWINGS

For a more complete understanding of this disclosure and its advantages, reference is now made to the following description, taken in conjunction with the accompanying drawings, in which.

DETAILED DESCRIPTION

FIGS. 1 through 10, discussed below, and the various embodiments used to describe the principles of this disclosure in this patent document are by way of illustration only and should not be construed in any way to limit the scope of the disclosure. Those skilled in the art will understand that the principles of this disclosure may be implemented in any suitably arranged wireless communication system.

The following documents and standards descriptions are hereby incorporated by reference into the present disclosure as if fully set forth herein: (i) Dimakis, Alexandros G., et al. "Network coding for distributed storage systems." Information Theory, IEEE Transactions on 56.9 (2010): 4539-4551 (hereinafter "REF1"); (ii) Suh, Changho, and Kannan Ramchandran. "Exact-repair MDS codes for distributed storage using interference alignment." Information Theory Proceedings (ISIT), 2010 IEEE International Symposium on. IEEE, 2010 (hereinafter "REF2"); (iii) Sub, Changho, and Kannan Ramchandran. "On the existence of optimal exact-repair MDS codes for distributed storage." arXiv preprint arXiv: 1004.4663 (2010) (hereinafter "REF3"); (iv) Rashmi, K. V., et al. "A hitchhiker's guide to fast and efficient data reconstruction in erasure-coded data centers." Proceedings of the 2014 ACM conference on SIGCOMM. ACM, 2014 (hereinafter "REF4"); and (v) Xiaoqing Fan, et al. "XF code: An erasure code for Distributed Storage Systems" (May 2015) 3 (hereinafter "Appendix").

Figure 1:
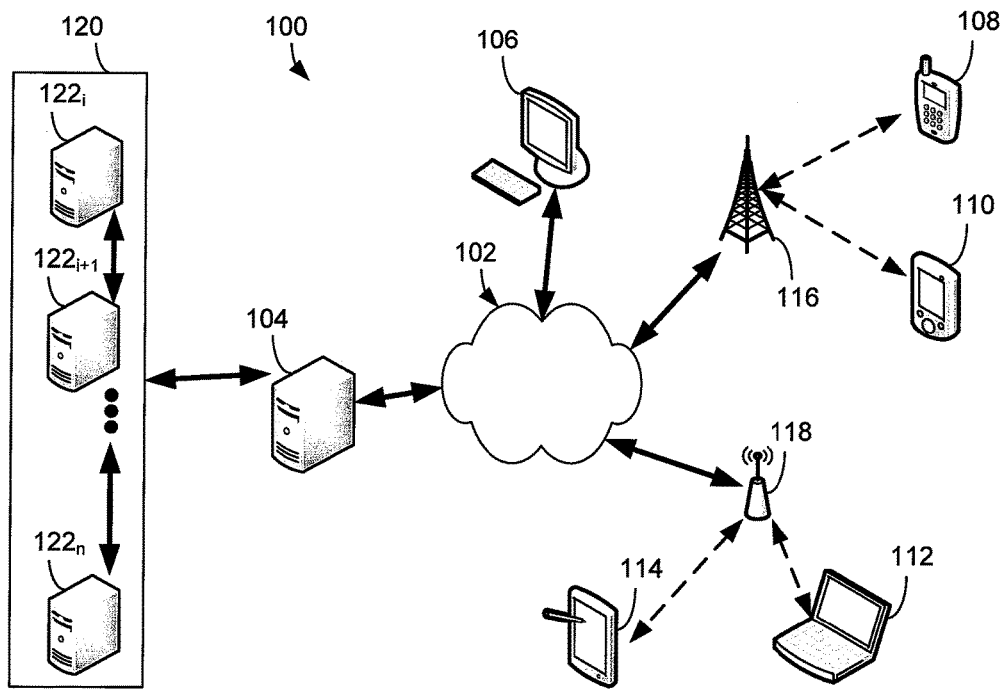
FIG. 1 illustrates an example computing system in which various embodiments of this disclosure may be implemented.

FIG. 1 illustrates an example computing system 100 according to this disclosure. The embodiment of the computing system 100 shown in FIG. 1 is for illustration only. Other embodiments of the computing system 100 could be used without departing from the scope of this disclosure.

As shown in FIG. 1, the system 100 includes a network 102, which facilitates communication between various components in the system 100. For example, the network 102 may communicate Internet Protocol (IP) packets, frame relay frames, Asynchronous Transfer Mode (ATM) cells, or other information between network addresses. The network 102 may include one or more local area networks (LANs), metropolitan area networks (MANs), wide area networks (WANs), all or a portion of a global network such as the Internet, or any other communication system or systems at one or more locations.

The network 102 facilitates communications between one or more servers 104 and various client devices 106-114. Each server 104 includes any suitable computing or processing device that can provide computing services for one or more client devices. Each server 104 could, for example, include one or more processing devices, one or more memories storing instructions and data, and one or more network interfaces facilitating communication over the network 102. For example, one or more of the servers 104 may include processing circuitry for repairing an erasure implementing the XF erasure code for distributed storage systems, as discussed in greater detail below.

Each client device 106-114 represents any suitable computing or processing device that interacts with at least one server or other computing device(s) over the network 102. In this example, the client devices 106-114 include a desktop computer 106, a mobile telephone or smartphone 108, a personal digital assistant (PDA) 110, a laptop computer 112, and a tablet computer 114. However, any other or additional client devices could be used in the computing system 100. In this example, some client devices 108-114 communicate indirectly with the network 102. For example, the client devices 108-110 communicate via one or more base stations 116, such as cellular base stations or eNodeBs. Also, the client devices 112-115 communicate via one or more wireless access points 118, such as IEEE 802.11 wireless access points. Note that these are for illustration only and that each client device could communicate directly with the network 102 or indirectly with the network 102 via any suitable intermediate device(s) or network(s). The client devices 106-114 connect to the server 104 and transfer data (e.g., text, digital images, social-media messages, video, audio, and the like) to the server 104 to be stored for later usage.

In this example, some client devices 108-114 communicate indirectly with the network 102. For example, the client devices 108-110 communicate via one or more base stations 116, such as cellular base stations or eNodeBs. Also, the client devices 112-114 communicate via one or more wireless access points 118, such as IEEE 802.11 wireless access points. Note that these are for illustration only and that each client device could communicate directly with the network 102 or indirectly with the network 102 via any suitable intermediate device(s) or network(s).

The computing system 100 further includes a distributed storage system (DSS) 120 that implements the XF erasure code according to this disclosure. The DS S 120 stores multiple copies of data on different machines. The DSS 120 is controlled by a DSS controller that is configured to control data within in the DSS 120 according to a configured level of data protection against erasures. The DSS 120 includes multiple nodes for storing data (for example, the user data transmitted from a client device 106-114) and parity generated by the DSS controller according to an erasure code. Each node can be a single disk drive or multiple drives. In this example, the DSS 120 includes multiple storage devices 122$i$-122$i$=n, and each storage device 122$i$-122$n$ represents a single node. The number of storage devices can be any number according to the system resources. The storage devices 122$i$-122$n$ can be any suitable device that stores data. For example, a storage device 122$i$-122$n$ can be included in a server that stores data. The storage devices 122$i$-122$n$ are controlled by the DSS controller that is configured to: in response to receiving data transmitted from a client device 106-114, generate k copies of the received data, generate a parity data for each of n–k parity nodes, select k of the storage devices 122$i$-122$n$ to store the k copies of the received data, the transmit each of the k copies of the received data to a respective one of the k selected storage devices (for example, storage devices 122$i$-122$k$ where n>k), transmit the parity data for each of the n–k parity nodes to the corresponding one of the n–k remaining storage devices (for example, storage devices 122k+1-122n).

The DDS 120 experiences frequent unavailability events, which can be caused by unreliable components, software glitches, maintenance shutdowns, power failures, and the like. Redundancy is necessary for reliability and availability of stored data.

An erasure code in a DSS can be characterized by as a (n, k) erasure code, where k represents the number of data nodes in the DSS, and n is a number greater than k by the number of nodal failures (NF) the DSS can tolerate. The number of nodal failures (NF) the DSS can tolerate is herein referred to as "r," which can also represent the number of parity nodes in the DSS. The XF erasure code is a (14, 10) vector code. The XF erasure code can repair up to four storage node failures (r=4). By carefully choosing the coefficients of the linear combinations for the four parity nodes, the XF erasure code maintains a Minimum Distance Separable property, but requires much less network bandwidth and disk I/O during reconstruction of one failure node. A DSS that implements the XF erasure code of this disclosure can reduce the repair network bandwidth in cloud storage systems while maintaining low storage cost. As described in more detail below, the XF erasure code provides the same level of reliability, the same storage overheads, and much lower repair bandwidth compared with a standard (14, 10) Reed-Solomon (RS) code. The DSS controller of the DSS 120 is configured to implement the XF erasure code for controlling the encoder and nodal failure repair functions.

Although FIG. 1 illustrates one example of a computing system 100, various changes may be made to FIG. 1. For example, the system 100 could include any number of each component in any suitable arrangement. In general, computing and communication systems come in a wide variety of configurations, and FIG. 1 does not limit the scope of this disclosure to any particular configuration. While FIG. 1 illustrates one operational environment in which various features disclosed in this patent document can be used, these features could be used in any other suitable system. For example, the server 104 can include the DSS controller to centralize control of the DSS 120. As another example, one or more of the storage devices 122$i$-122$n$ can include processing circuitry implementing the DSS controller functions.

Figure 2:
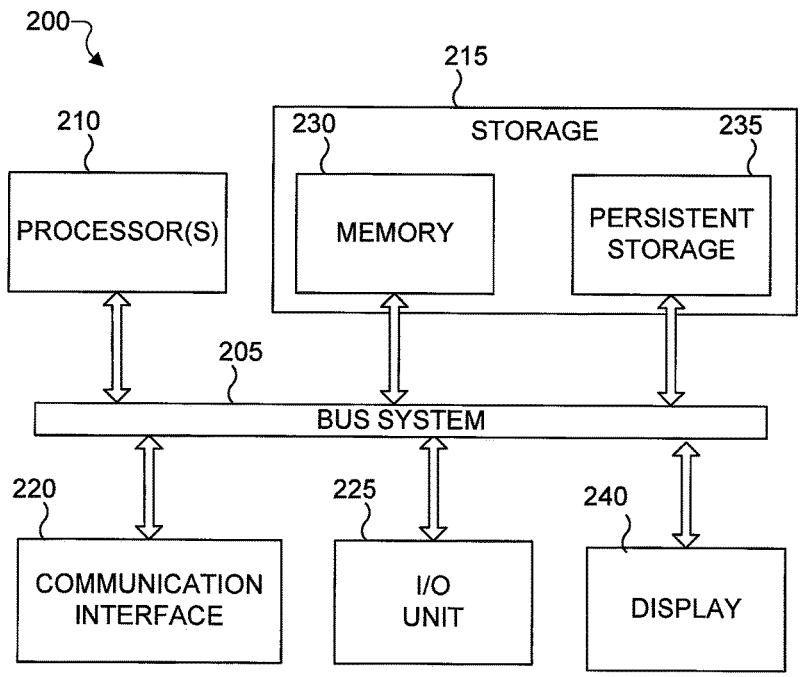
FIG. 2 illustrates an example processing device according to this disclosure.

FIG. 2 illustrates an example processing device 200 according to this disclosure. In particular, the processing device 200 illustrates example components that may be included in any one of the server 104 or the client devices 106-115 in FIG. 1 to implement one or more embodiments of the present disclosure.

As shown in FIG. 2, the processing device 200 includes a bus system 205, which supports communication between at least one processor 210, at least one storage device 215, at least one communication interface 220, at least one input/output (I/O) unit 225, and a display 240.

The processor 210 executes instructions that may be loaded into a memory 230. The processor 210 may include any suitable number(s) and type(s) of processors or other devices in any suitable arrangement. Example types of processor 210 include microprocessors, microcontrollers, digital signal processors, field programmable gate arrays, application specific integrated circuits, and discreet circuitry. For example, the processor 210 may implement the XF erasure code for distributed storage systems or DSS controller functions performed by any of the systems 500-900 being implemented in hardware or by executing stored instructions that causes the processor 210 to perform the disclosed methods.

The memory 230 and a persistent storage 235 are examples of storage devices 215, which represent any structure(s) capable of storing and facilitating retrieval of information (such as social-media messages, program code, and/or other suitable information on a temporary or permanent basis). The memory 230 may represent a random access memory or any other suitable volatile or non-volatile storage device(s). For example, the memory 230 may contain instructions for implementing the XF erasure code for distributed storage systems received from a server 104. The persistent storage 235 may contain one or more components or devices supporting longer-term storage of data, such as a read-only memory, hard drive, Flash memory, or optical disc.

The communication interface 220 supports communications with other systems or devices. For example, the communication interface 220 could include a network interface card, a cable modem, or a wireless transceiver facilitating communications over the network 102. The communication interface 220 may support communications through any suitable physical or wireless communication link(s).

The I/O unit 225 allows for input and output of data. For example, the I/O unit 225 may provide a connection for user input through a keyboard, mouse, keypad, touchscreen, or other suitable input device. The I/O unit 225 may also send output to the display 240, printer, or other suitable output device.

The processing device 200 further includes or is connected to a display 240. In one example embodiment, the processing device 1300 may be a server connected to the display 240 over a network connection. In another example embodiment, the processing device 200 may include the display 240. For example, the processing device 200 may be a television, monitor, mobile phone, laptop computer, tablet computer, etc., able to provide a visual indicator of a nodal failure within the DSS 120.

Figures 3A, 3B, 4:
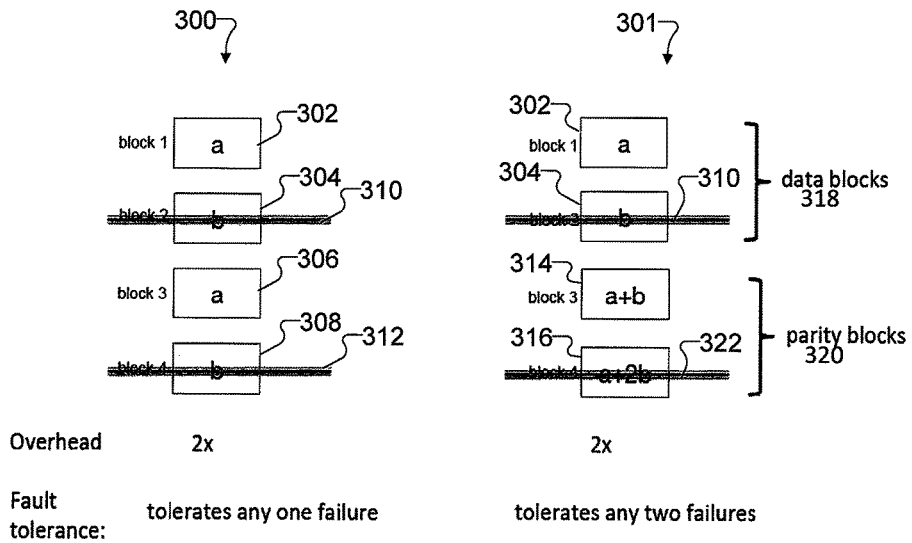
FIGS. 3A and 3B illustrate example levels of data protection against erasures in a DSS according to a replication method and the Reed-Solomon code.
FIG. 4 illustrates a performance table comparing the performance of various (14, 10) erasure codes in the event of a single node failure according to this disclosure.

FIGS. 3A and 3B illustrate example levels of data protection against erasures in a DSS according to a replication method and the RS code. FIG. 3A shows an example level of data protection against erasures in a DSS 300 according the replication method. The DSS 300 includes four storage blocks 302, 304, 306, 308 for storing data. Each of the first storage block 302 and the third storage block 306 store data "a" to provide redundancy to each other in the case of a single nodal failure. Each of the second storage block 304 and the fourth storage block 308 store data "b" to provide redundancy to each other in the case of a single nodal failure. The replication method has a 2× overhead, as DSS 300 stores each original data twice.

In the event of a single node failure 310, the data (for example, data "b") stored on the failed storage block is erased or lost from the failed storage block (for example, the second storage block 304), yet a DSS controller of the DSS 300 can repair the failed storage by generating a copy of the data (for example, data "b") stored on a redundant storage block (for example, the fourth storage block 308) that redundantly stores the lost data. In order to repair the failed storage block, the DSS controller uses a repair bandwidth (RBW) having a size determined by copying the data (for example, data "b") stored on a redundant storage block (for example, the fourth storage block 308). In this example, the RBW has the size of the data "b."

However, in the event of a two node failure 310 and 312, the data (for example, data "b") stored on the failed storage blocks are erased or lost from the failed storage blocks (for example, the second and fourth storages block 304 and 308) and cannot be recovered because the DSS 300 does not include a third redundant storage block that redundantly stores the lost data. Accordingly, the replication method can only tolerate any single node failure.

Although FIG. 3A shows one example DSS 300 according to a replication method, various changes can be made to the embodiment of FIG. 3A. For example, the Hadoop Distributed File System stores three replicas by default. The disadvantage of three replicas is a massive overhead (3×) in order to achieve a fault tolerance of two nodal failures. Erasure codes provide the same level of reliability (fault tolerance) with less overhead than the replication methods.

FIG. 3B shows an example level of data protection against erasures in a DSS 301 according to the RS code. The DSS 301 includes four storage blocks 302, 304, 314, 316 for storing data, including a set of data blocks 318 and a set of parity blocks 320. The set of data blocks 318 includes the first storage block 302 storing data original "a" and the second storage block 304 storing original data "b." The set of parity blocks 320 includes a third storage bock 314 storing a first parity data "a+b" generated according to the RS code and a fourth storage block 316 storing a second parity data "a+2b" generated according to the RS code. Each parity block provides redundancy to both storage blocks 302 and 304 in the set of data blocks 318. The RS code method has a 2× overhead, as the DSS 301 stores each original data and additionally stores one parity block per original data.

In the event of a single node failure 310 in the set of data blocks 318, the original data (for example, original data "b") stored on the failed storage block is erased or lost from the failed storage block (for example, the second storage block 304), yet a DSS controller of the DSS 300 can repair the failed storage block. In order to repair the failed storage block, the DSS controller uses a RBW having a size determined by obtaining the remaining original data (for example, original data "a") stored on the remaining data block (for example, first storage block 302) and obtaining a single parity data (for example, parity data "a+b" or "a+2b") stored on either parity block 314 or 316. During the repair, the original data "a" can be subtracted from the single parity data "a+b" such that the difference data "b" can be copied to the failed storage block. In this example, the RBW has the size of the remaining original data "a" in addition to the single parity data. For comparison, to repair the loss of an original data in the event of a single node failure 310, the RBW of the RS code method is greater than the RBW of the replication method. That is, a disadvantage of the RS code is this significant increase of RBW, network bandwidth consumption during reconstruction.

In the event of a two node failure 310 and 322, the original data "b" and parity data "a+2b" stored on the failed storage blocks are erased or lost from the failed storage blocks 304 and 316, yet a DSS controller of the DSS 301 can repair both of the failed storage blocks using the remaining original data "a" and remaining parity data "a+b." Accordingly, the RS code method can tolerate any two node failures.

FIG. 4 illustrates a performance table 400 comparing the performance of various (14, 10) erasure codes in the event of a single node failure according to this disclosure. In the performance table 400, each column corresponds to a different erasure code, including the Reed-Solomon code (RS), the Hitchhiker code according to REF4, the XF erasure code according to this disclosure, and the Minimum Storage Regenerating (MSR) code. Each row of the performance table 400 corresponds to overhead, blocklength (measured in bytes), size of RBW consumed during reconstruction of a failed data node (Data Nodes RBW), size of RBW consumed during reconstruction of a failed parity node (Parity Nodes RBW), and an average size of RBW consumed during reconstruction of a failed node. Noted that compared to each of three other erasure codes, the XF erasure code of this disclosure exhibits a reduced RBW during reconstruction of a single data node (44.5%), a single parity node (77.5%), and on average (53.9%). The RBW is measured by the percentage of the original message size.

Figure 5:
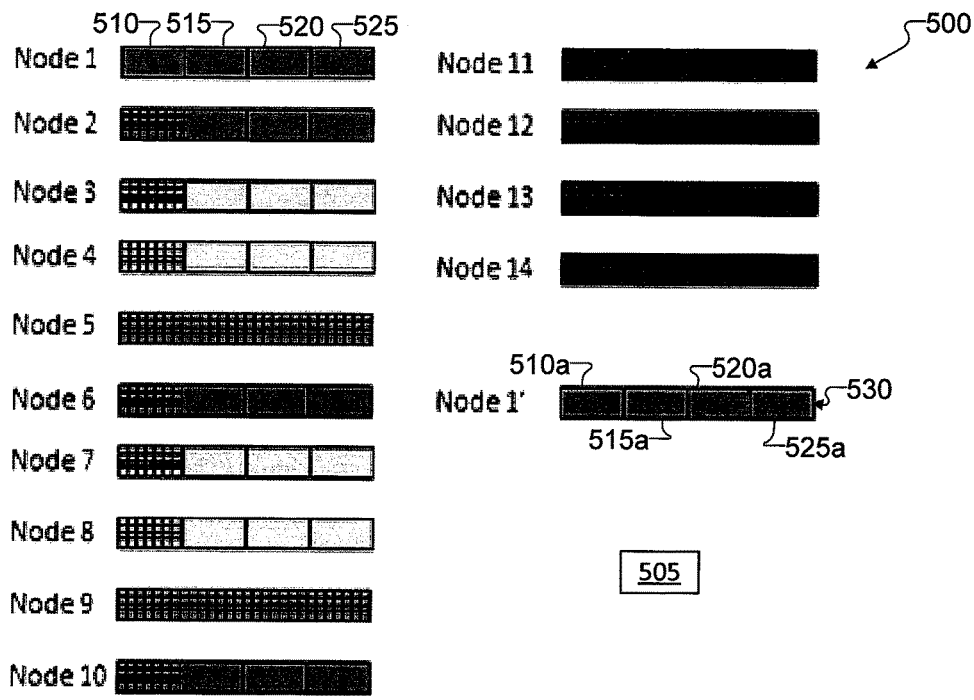
FIG. 5 illustrates an example distributed storage system (DSS) for reconstructing a failed node by implementing the XF erasure code according to this disclosure.

FIG. 5 illustrates an example DSS system 500 for reconstructing a failed node by implementing the XF erasure code according to this disclosure. FIG. 5 shows that the DSS system 500 implements a (14, 10) XF erasure code for reconstruction of a failed node. The DSS system 500 includes 14 nodes (Node 1, Node 2, ... Node 14) and a DSS controller 505 configured to implement the XF erasure code to control data stored in each node. Accordingly, the DSS controller 505 is operably coupled to each of the nodes in the DSS system 500. The 14 nodes of DSS 500 include a set of 10 data nodes for storing data packets and a set of 4 parity nodes for storing parity packets. In the example shown, the set of data nodes includes Node 1 -Node 10, and the set of parity nodes includes Node 11-Node 14, however it is understood that in other examples, any node can be selected for storing either a data packet or a parity packet. Each data node stores 5 bytes, namely, n–k=4 symbols, each symbol being in GF($2^{10}$). For example, Node 1 includes a first symbol 510, a second symbol 515, and third symbol 520, and a fourth symbol 525.

As an example, the DSS system 500 can include the DSS 120. As such, each of the multiple storage devices 122$i$-122$i$=n of FIG. 1 can be each of the 14 nodes (Node 1, Node 2, ... Node 14) included in the DSS system 500 of FIG. 5. Also, the functions of the DSS controller 505 can be performed by the processor 210 of FIG. 2, or within processing circuitry within the one of more servers 104 or within of the storage devices 122*i*-122*i*-1*i* of FIG. 1.

The DSS controller 505 detects the event of a nodal failure of any of the 14 nodes. This detection operation is also described below according to reference 744 of FIG. 7D. The DSS controller 505 can detect the event of multiple nodal failures and determine a count of the number of nodal failures. This counting operation is also described below according to reference 746 of FIG. 7D. In response to detecting an event of five of more nodal failures, the DSS controller 505 shuts down the DSS system 500 (shown in block 748 of FIG. 7D). In response to detecting an event of more than one nodal failure and less than five nodal failures (i.e., 2, 3, or 4 failures), the DSS controller implements a traditional repair function (shown in block 750 of FIG. 7D). A traditional repair function can include a reconstruction according to the RS code, or other suitable method of nodal repair. In response to detecting an event of a single-node failure, the DSS controller 505 implements a repair method according to the XF erasure code.

Figure 7A:
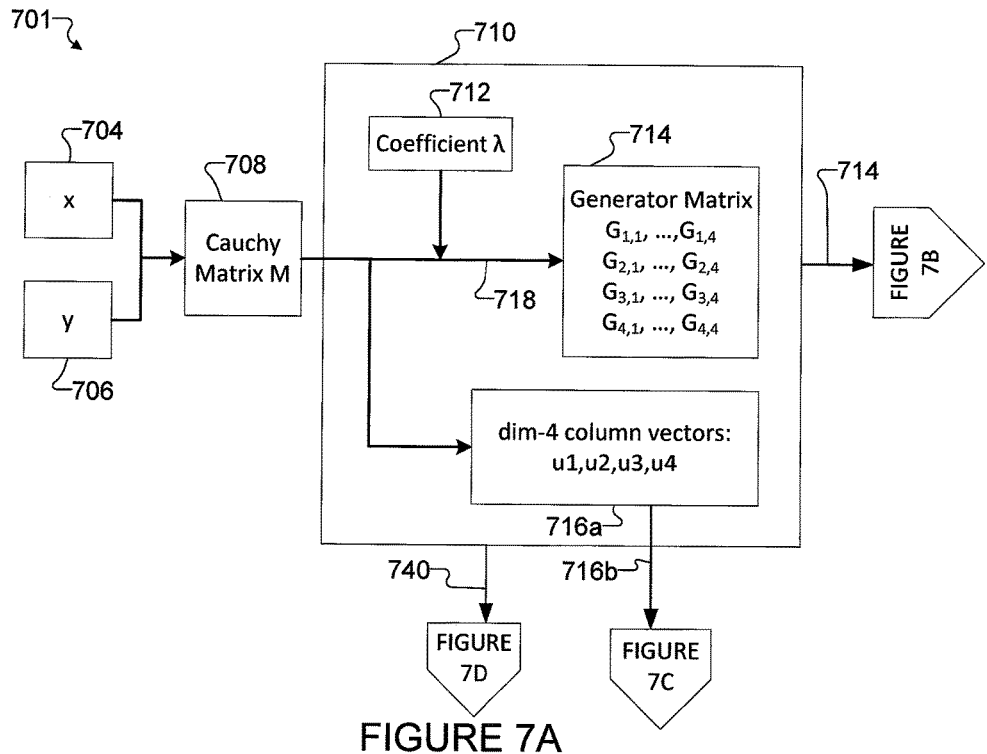
FIGS. 7A through 7F illustrate a block diagram of an XF erasure code encoder and repair system according to this disclosure.
Figure 7C:
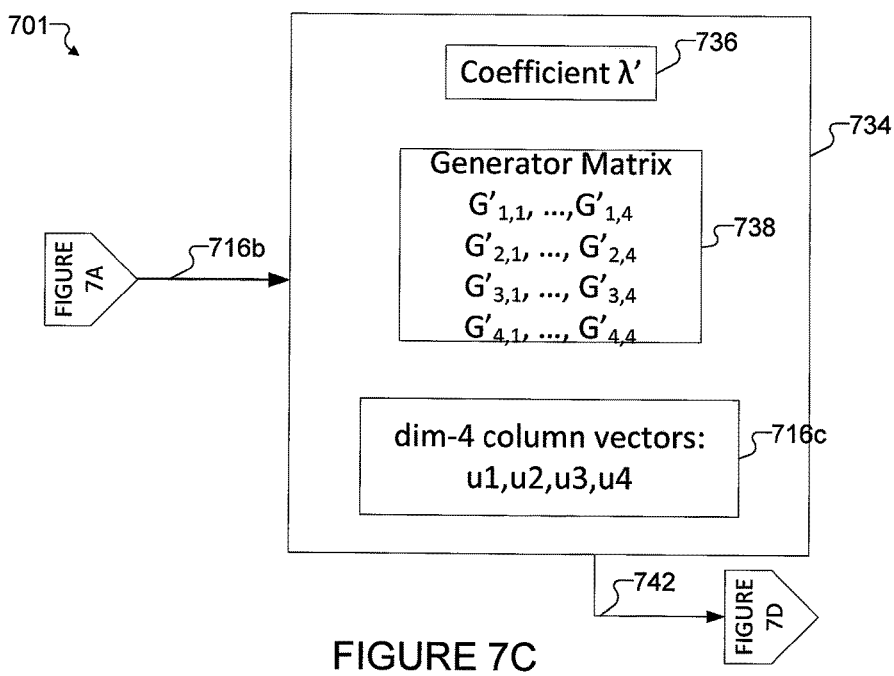
Figure 7B:
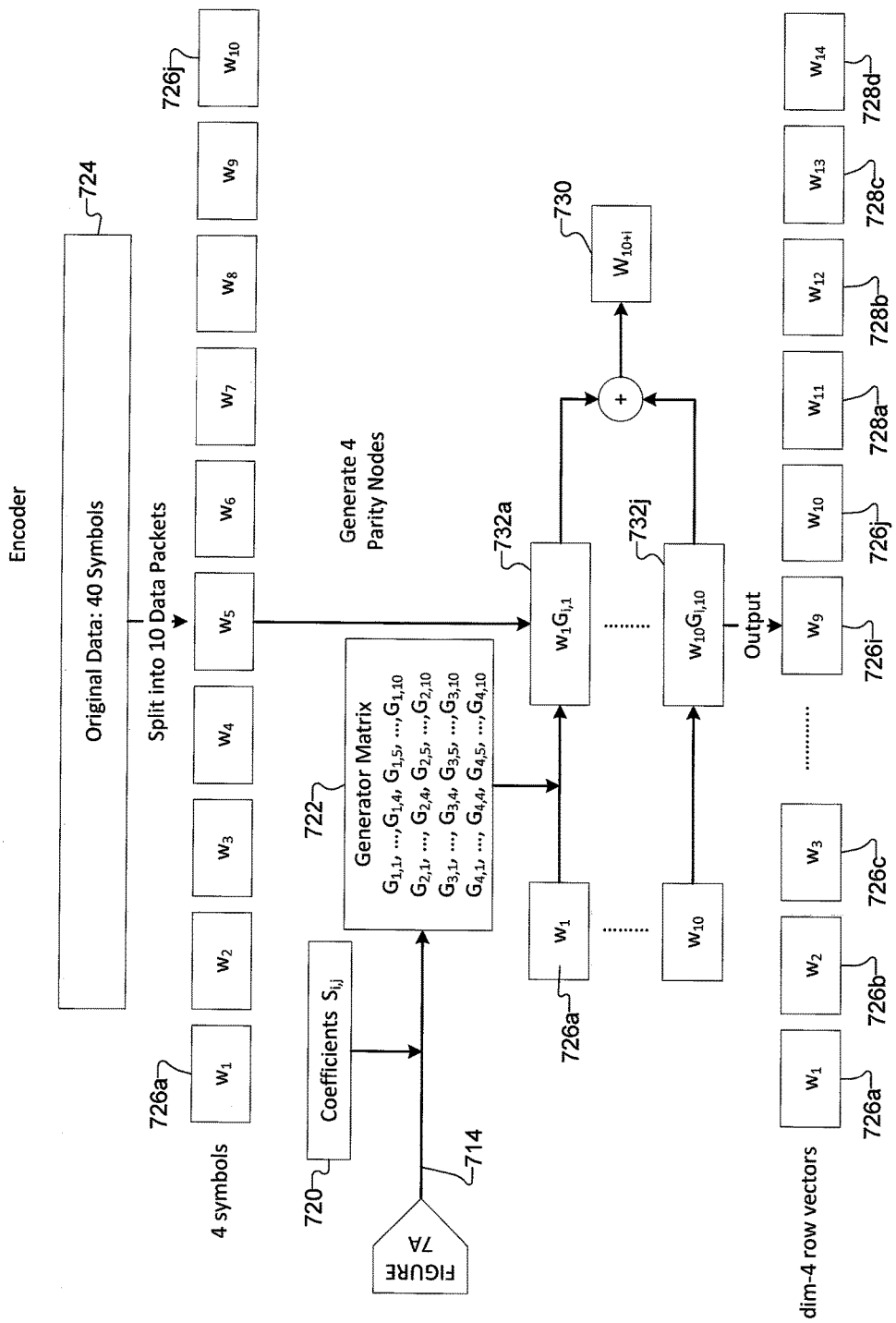
Figure 7D:
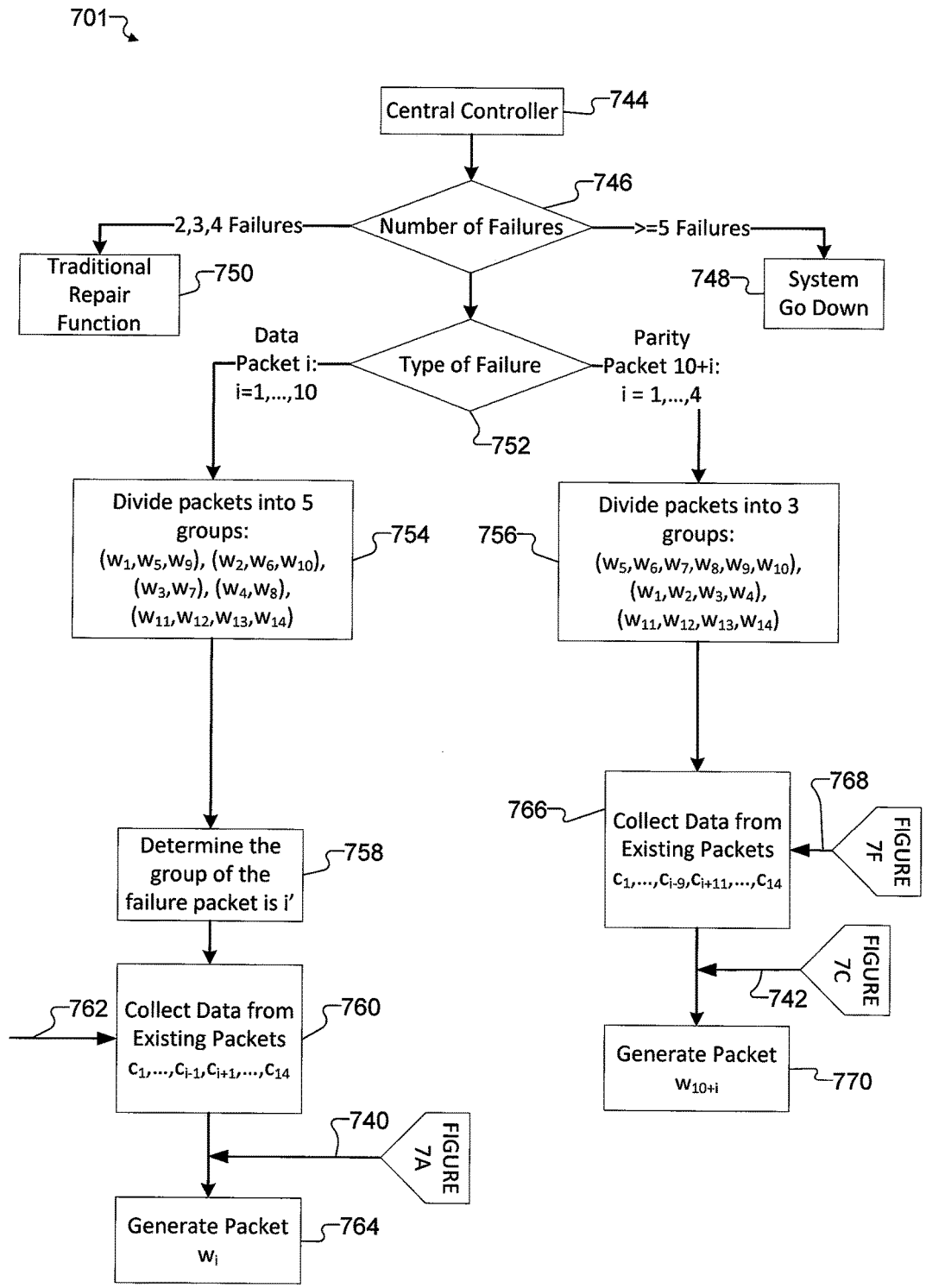

In implementing a repair method according to the XF erasure code, the DSS controller 505 determines the type of failure as either a failure of a node storing a data packet or a failure of a node storing a parity packet (shown in block 752 of FIG. 7D). The DSS controller 505 can determine the type of failure based on an identification of the failed node. More particularly, the DSS controller 505 compare the identification of the failed node with a data node list and with a parity node list. The DSS controller 505 can determine that a data node failed based the identification of the failed node matching identification information in the data node list. The DSS controller 505 can determine that a parity node failed based the identification of the failed node matching identification information in the parity node list. The DSS controller 505 can generate and store the data node list as a listing identification information for each of the k selected nodes to which one of the k copies of received data is transmitted. The DSS controller 505 can generate and store the parity node list as a listing identification information for each of the n–k remaining nodes to which a parity data is transmitted. In the example shown, the DSS controller 505 selects Node 1-Node 10 (for example, storage devices 122*i*-122*k* where k=10) to store data packets, and selects Node 11-Node 14 to store parity packets (for example, storage devices 122k+1-122n where n=14).

In implementing a repair method according to the XF erasure code, the DSS controller 505 divides the nodes (Node 1-Node 14) into two or more groups (shown in blocks 754 and 756 of FIG. 7D). The number of groups is based on the type of failure. The DSS controller 505 divides the nodes into five (5) groups (namely Groups 1-5) based on a determination that a data node failed. The first, second, third, and fourth original data are stored in Groups 1, 2, 3, and 4, respectively. The parity data is stored in Group 5. In the example shown, Group 1 includes Nodes 1, 5, and 9; Group 2 includes Nodes 2, 6, and 10; Group 3 includes Nodes 3 and 7; and Group 4 includes Nodes 4 and 8. Group 5 includes the parity nodes, namely Nodes 11-14, wherein each node stores the parity data packet.

Regardless of whether the type of failure, the RBW of the XF erasure code requires a full node only for a missing node from the same group, and requires only a single symbol from the nodes in the other groups. To repair one node, storage nodes in the same group transmit 4 symbols, and storage nodes in other groups transmit 1 symbol. In implementing a repair method according to the XF erasure code, the DSS controller 505 determines the group number i' of the failed node (shown in block 758 of FIG. 7D); collects required data from existing nodes using the RBW (shown in block 760 of FIG. 7D); and generates a reconstructed node 530 using the collected required data (shown in block 764 of FIG. 7D). The reconstructed node 530 includes a recovered symbols 510*a*, 515*a*, 520*a*, 525*a* of the first through fourth symbols that were lost.

As a specific example, in the event of a single-node failure or loss of Node 1 (storage device $122_{i=1}$), the DSS controller 505 determines that a data node failed based on Node 1 having an identification i=1 associated with the k nodes (Nodes 1-10) selected to store copies of original data. The DSS controller 505 determines that the failed Node 1 belongs to Group 1, which has a group number i'=1. The DSS controller 505 collects required data (shown as crosshatched symbols) from existing nodes using the RBW. The required data includes one full node from each node in the same group. The DSS controller 505 determines that the group number i'=1 for the failed Node 1 is the same for Nodes 5 and 9. Accordingly, the DSS controller collects 4 symbols from Node 5 and 4 symbols from Node 9 as required data. The required data additionally includes one symbol from each node in a different group. The DSS controller 505 determines that the group number i'=1 for the failed Node 1 is the different for Nodes 2-4, 6-8, and 10-14. Accordingly, the DSS controller collects 1 symbol (for example, the first symbol 510) from Nodes 2-4, 6-8, and 10-14 as required data. Collecting the required data for reconstructing the failed data Node 1 consumes 19 symbols (namely, 95 bytes) of RBW. The DSS controller generates reconstructed node 530 (Node 1') using the 19 symbols of collected required data.

Although this specific example is described in terms of repairing the loss of Node 1, other nodes in the DSS system 500 can be repaired implementing this repair method according to the XF erasure code. More particularly, in the event of a single-node failure of any of Nodes 1, 5, 9, 2, 6, or 10, which belong to a group of size 3, the DSS controller 505 consumes RBW having a size determined by obtaining the 19 symbols of required data. In the event of a single-node failure of any of Nodes 3, 7, 4, or 8, which belong to a group of size 2, the DSS controller 505 consumes RBW having a size determined by obtaining the 16 symbols of required data. In the event of a single-node failure of any of Nodes 11-14 which belong to a group of size 4, the DSS controller 505 consumes RBW having a size determined by obtaining the 31 symbols of required data.

Although FIG. 5 shows one example DSS system 500, various changes can be made to the embodiment of FIG. 5. For example, the DSS controller 505 can determine that a data node failed based on the identification of the failed node being absent from the parity node list, which is a shorter list causing a faster determination.

Figure 6:
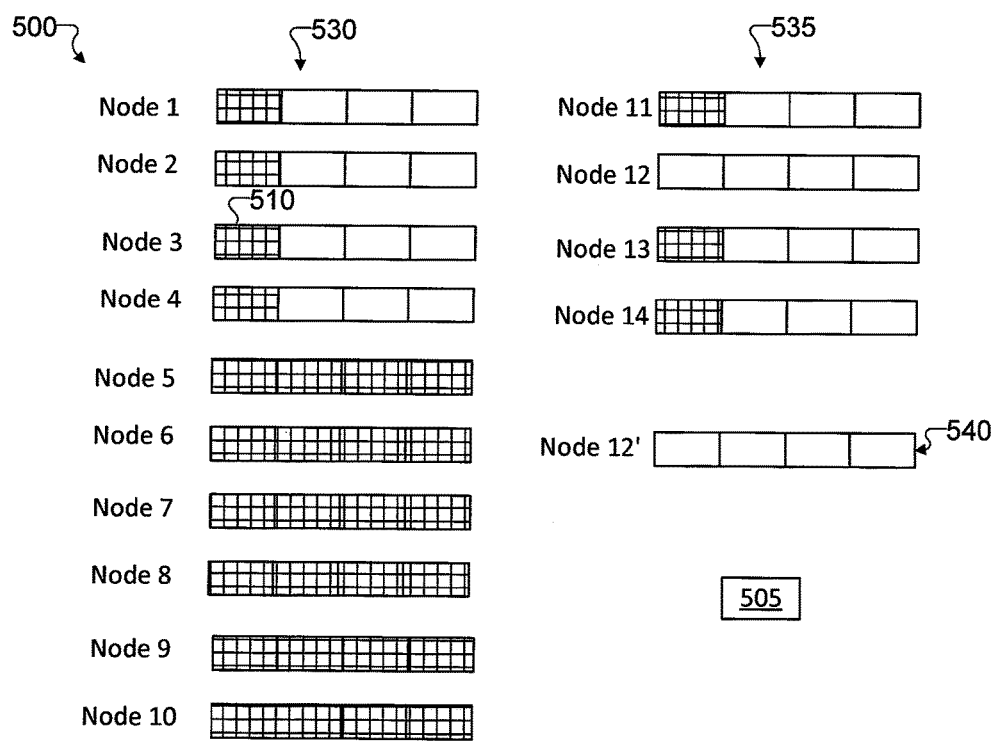
FIG. 6 illustrates the DSS system of FIG. 5 implementing the (14, 10) XF erasure code for reconstruction of a failed parity node according to this disclosure.

FIG. 6 illustrates the DSS system 500 of FIG. 5 implementing the (14, 10) XF erasure code for reconstruction of a failed parity node according to this disclosure. In the example shown, the set 530 of data nodes includes Node 1-Node 10, and the set 535 of parity nodes includes Node 11-Node 14, however it is understood that in other examples, any node can be selected for storing either a data packet or a parity packet.

As a specific example, in the event of a single-node failure or loss of Node 12 (storage device 122i=12), the DSS controller 505 determines that a parity node failed based on Node 12 having an identification i=12 associated with the n−k nodes (Nodes 11-14) selected to store parity data generated according to the XF code. The DSS controller 505 divides the nodes into two groups (namely, Groups A and B) based on a determination that a parity node failed. Group A includes the Nodes 5, 6, 7, 8, 9, and 10. Group B includes the parity nodes, namely Nodes 11-14, as well as a data node storing each original data, namely, Nodes 1-4. The DSS controller 505 determines that the failed Node 12 belongs to Group B, for example based on matching the identification of failed Node 12 with identification information in the parity node list. The DSS controller 505 collects required data (shown as crosshatched symbols) from existing nodes using the RBW. The required data includes one full node from each node in Group A, and additionally includes one symbol from each existing node in Group B. Accordingly, the DSS controller collects 4 symbols from each of Nodes 5, 6, 7, 8, 9, and 10 as required data. Also, the DSS controller collects 1 symbol (for example, the first symbol 510) from Nodes 1-4 and 11-14 as required data. Collecting the required data for reconstructing the failed parity Node 12 consumes 31 symbols (namely, 124 bytes) of RBW. The controller generates reconstructed node 540 (Node 12') using the 31 symbols of collected required data. Consuming 31 symbols of RBW to reconstruct 4 symbols of lost data is equivalent to consuming 7.75 nodes of RBW to re-establish the set 530 of ten data nodes (i.e. 77.5% shown in the performance table 400 of FIG. 4).

Although FIG. 6 shows one example DSS system 500, various changes can be made to the embodiment of FIG. 6. For example, upon a determination that a parity node failed, the DSS controller 505 could divide the nodes into three groups, namely, Groups A, C, and D. Group C includes a data node storing each of the first, second, third, and fourth original data, namely, Nodes 1-4. Group D includes the parity nodes, namely Nodes 11-14. That is, the combination of Groups C and D is the same as Group B.

FIGS. 7A-F illustrate block diagrams of an XF erasure code encoder and repair system 700 according to this disclosure. The XF erasure code encoder and repair system 700 shown in FIGS. 7A-F is for illustration only. Other embodiments can be used without departing from the scope of this disclosure. As an example, the XF erasure code encoder and repair system 700 could be implemented by the server 104 executing functions of the DSS controller to control the DSS 120. As another example, the XF erasure code encoder and repair system 700 could be implemented by the DSS system 500.

Figure 7E:
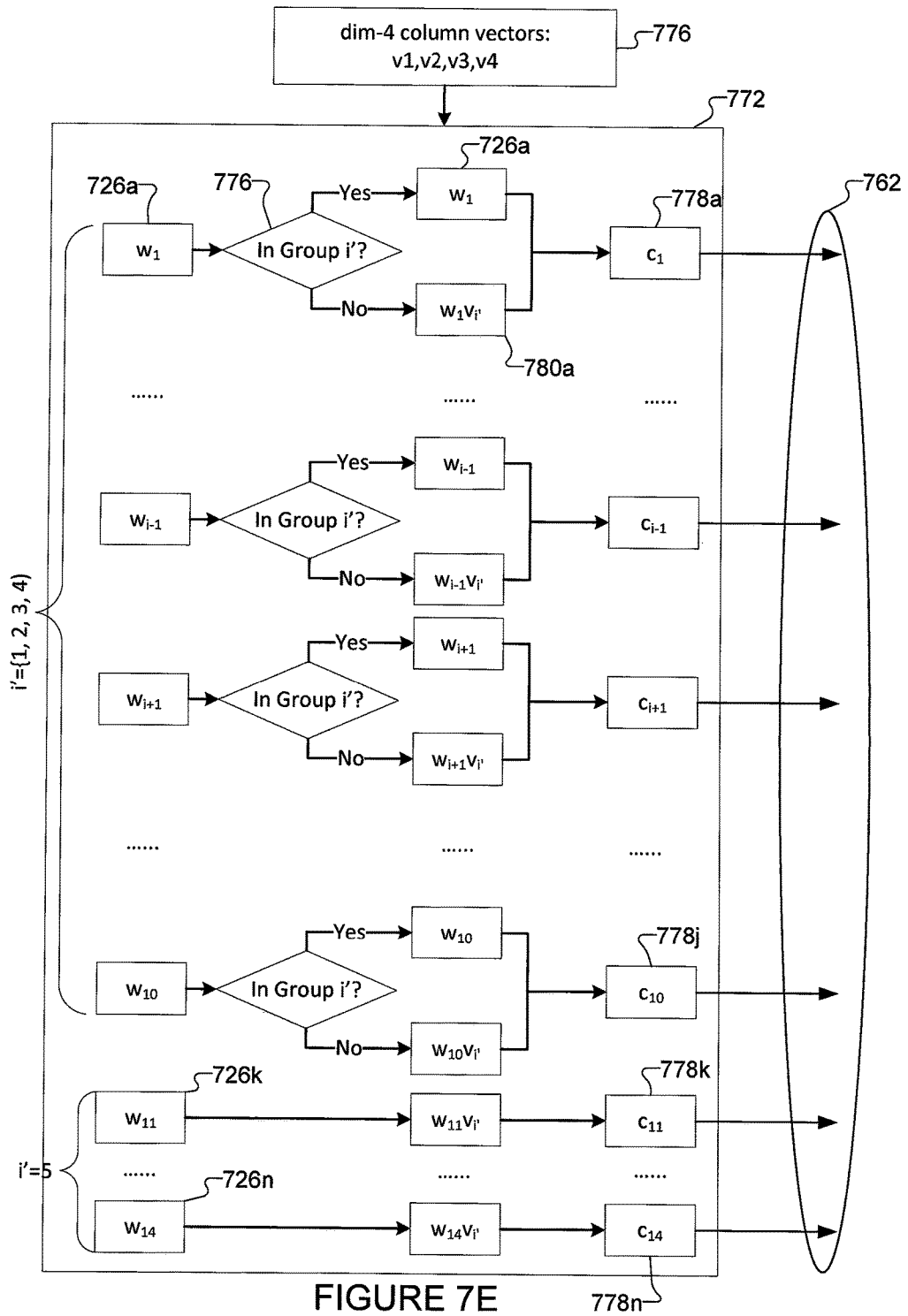
Figure 7F:
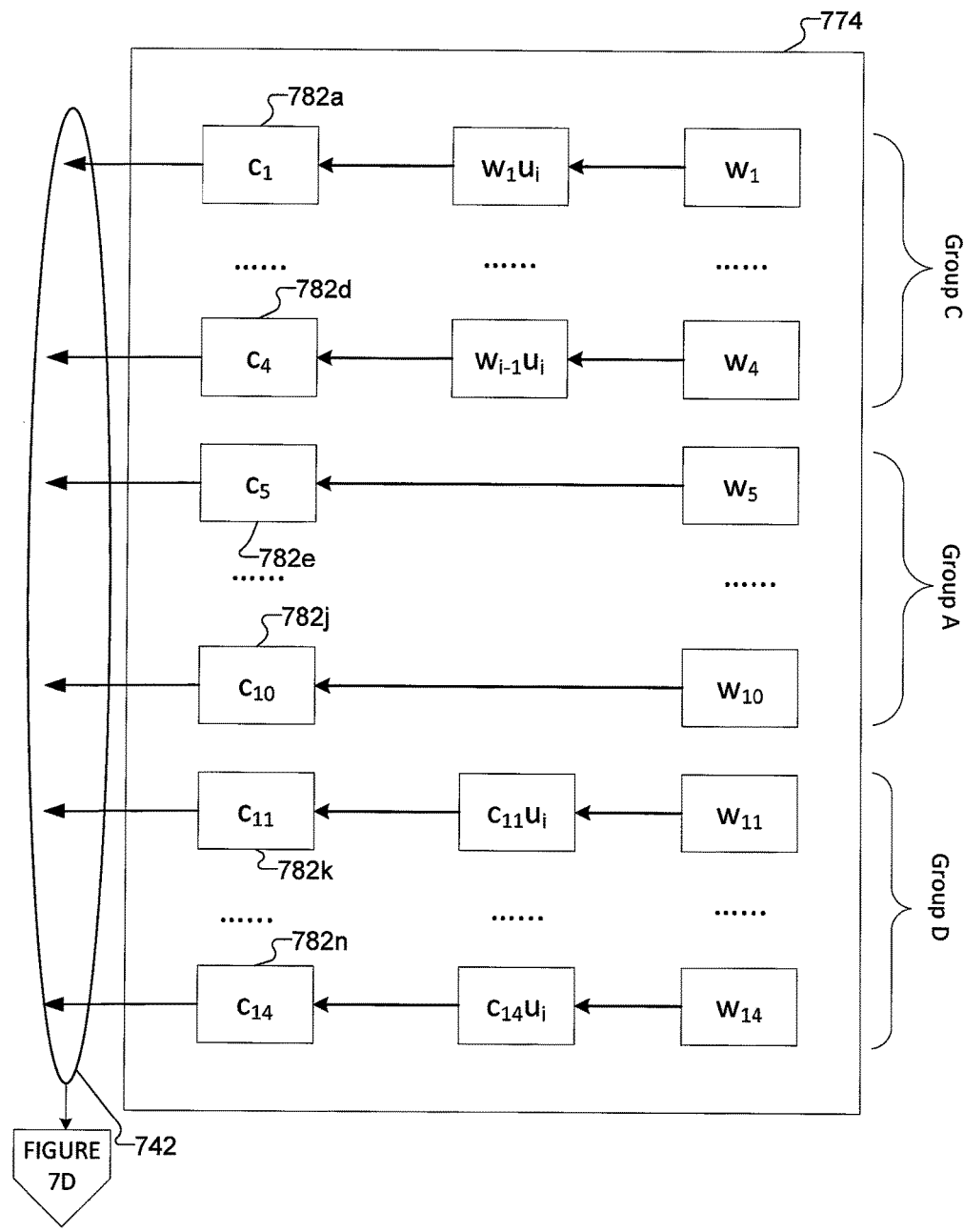

The system 700 includes an encoder 701 and a repairer 702. The components of the encoder 701 are shown in FIGS. 7A-7C; and the components of the repairer 702 are shown in FIGS. 7D-7F. For simplicity, FIGS. 7A-F will be described as if the DSS controller includes or performs the functions of the encoder 701 and the repairer 702.

As shown, in FIG. 7A, at the encoder 701, the system 700 receives multiple inputs {x, y} of pairwise different numbers, including a first input 704 ($x$), and a second input 706 ($y$). The system 700 uses the multiple inputs to generate a Cauchy Matrix 708 (M).

The encoder 701 generates a Cauchy Matrix 708 (M). In order to generate the Cauchy Matrix 708 (M), the multiple inputs first input 704 should have the form $\vec{x} = x_1, \ldots, x_{n-k}$, and the second input should have the form $\vec{y} = y_1, \ldots, y_{n-k}$, forming pairwise different numbers $\{x_1, \ldots, x_{n-k}, y_1, \ldots, y_{n-k}\}$. As described more particularly in Section 3.1 of the Appendix, the Cauchy Matrix 708 can be generated according to Equation 1, where i represents an index for the elements of the multiple inputs 704, 706:

$$M = \frac{1}{(x_i - y_i)}. \tag{1}$$

The encoder 701 includes a first processing block 710 that receives the Cauchy Matrix 708, stores a λ coefficient 712, generates a first portion a generator matrix 714, and generates n−k column vectors 716a (u1, u2, u3, u4) having a dimension dim-(n−k). The encoder 701 can arbitrarily choose a value of the λ coefficient 712 from $GF(2N)\setminus\{1,-1,0\}$.

The first processing block 710 generates the first (n−k) columns of the generator matrix (G) as expressed in Equation 2, where j represents the column index of the generator matrix for (1≤j≤n−k), and i represents the row index of the generator matrix for (1≤i≤n−k). The first processing block 710 uses the product 718 (λM) of the λ coefficient 712 and the Cauchy Matrix 708 to generate the first portion a generator matrix 714, namely, the first four (n−k) columns of the generator matrix (G). Sections 3.1 of the Appendix provides further details of calculating the first (n−k) columns of the generator matrix (G).

$$G_{i,j} = \begin{bmatrix} G_{i=1,j=1} & \ldots & G_{1,4} \\ G_{2,1} & \ldots & G_{2,4} \\ G_{3,1} & \ldots & G_{3,4} \\ G_{4,1} & \ldots & G_{4,4} \end{bmatrix} \tag{2}$$

The first processing block 710 generates four dim-4 column vectors 716a according to Equation 3. The encoder 701 copies the four dim-4 column vectors 716a to a second processing block 734 of the encoder 701 via a first link 716b. The first processing block 710 provides information to the repairer 702 through a second link 740.

$$\vec{u_1} = (\vec{u_1}, \vec{u_2}, \vec{u_3}, \vec{u_4}) = \lambda M \tag{3}$$

As shown in FIG. 7B, the encoder 701 generates the remaining (k+1 through n) columns the generator matrix (G) as expressed in Equation 4, where j represents the column index of the generator matrix for (k+11≤j≤n), and i represents the row index of the generator matrix for (1≤i≤n−k). The encoder 701 uses the first portion a generator matrix 714 and the Si,j coefficients 720 to generate the complete generator matrix 722 (G) as expressed in Equation 5. Section 3.2 of the Appendix provides further details of calculating the complete generator matrix 722.

$$G_{i,j} = \begin{bmatrix} G_{i=1,j=5} & \ldots & G_{1,10} \\ G_{2,5} & \ldots & G_{2,10} \\ G_{3,5} & \ldots & G_{3,10} \\ G_{4,5} & \ldots & G_{4,10} \end{bmatrix} \tag{4}$$

$$G_{i,j} = \begin{bmatrix} G_{1,1} & \ldots & G_{1,4}, G_{1,5} & \ldots & G_{1,10} \\ G_{2,1} & \ldots & G_{2,4}, G_{2,5} & \ldots & G_{2,10} \\ G_{3,1} & \ldots & G_{3,4}, G_{3,5} & \ldots & G_{3,10} \\ G_{4,1} & \ldots & G_{4,4}, G_{4,5} & \ldots & G_{4,10} \end{bmatrix} \tag{5}$$

The encoder 701 receives original data 724 as input. For example, the original data 724 can include 40 symbols. The encoder 701 splits the original data 724 into multiple data packets 726a-726j, namely k=10 data packets (w1 though w10). Each of the data packets 726a-726j can be stored in one data node, and can also be referred to as the corresponding data node. Each data packet 726a-726j includes four symbols. For example, the 40 symbols of original data can be split and stored in Nodes 1-Node 10 of the DSS system 500 of FIG. 5. The encoder 701 outputs each of the k data packets 726a-726j as dim-4 row vectors, and transfers the k data packets 726a-726j to selected storage devices, such as the storage devices storage devices 1221-12210 of FIG. 1.

The encoder 701 generates and outputs r (i.e., r=n-k) parity packets 728a-728d using the complete generator matrix 722 and the set of k data packets 726a-726j. The encoder 701 outputs each of the r parity packets 728a-728d as dim-4 row vectors, and transfers the r parity packets 728a-728d to storage devices, such as the storage devices storage devices 12211-12214 of FIG. 1.

To generate w11, namely, a first individual parity packet 730 (wk+i or w10+i), the encoder 701 multiples a jth column of the first row (i=1) of the in the complete generator matrix 722 by of the jth data packet 726a (wj) in order to generate a jth product 732a (wjG1,j); and the encoder 701 repeats this process for each of the j columns (j=1, 2, . . . j=10) in the complete generator matrix 722 in order to generate ten products 732a-732j, including a tenth product 732j (w10G1, 10). The encoder 701 generates the first individual parity packet 730 (w11) as the sum of the products 732a-732j corresponding to the first row (i=1) of the in the complete generator matrix 722. The encoder 701 operates in an analogous manner to generate the second individual parity packet 730 (w12) as the sum of the products 732a-732j corresponding to the second row (i=2) of the in the complete generator matrix 722. The encoder generates the third and fourth individual parity packets 730 (w13 and w14) by operating in an analogous manner corresponding to a respective third and fourth row of the in the complete generator matrix 722.

As shown in FIG. 7C, the encoder 701 includes a second processing block 734, which stores a λ' coefficient 736, an auxiliary generator matrix (G') 738, and n-k dim-4 column vectors 716c for decoding. In the example shown, the four dim-4 column vectors 716a can be provided to the second processing block 734 via the first link 716b. Section 3.2 of the Appendix provides additional details regarding generating the information in the second processing block 734. The second processing block 734 provides information to the repairer 702 through a third link 742.

As shown in FIG. 7D, the repairer 702 includes various process blocks 744 for repairing/reconstructing a failed node implementing the XF erasure code. The operations of the repairer 702 can be performed by the DSS controller of the system 700.

The repairer 702 includes a centralized DSS controller block 744 that monitors the availability of and detects the event of a nodal failure within the set of k data packets 726a-726j and the set of r parity packets 728a-728d. For example, the centralized DSS controller block 744 includes monitoring the Nodes 1-Node 14 of FIG. 5 and/or the storage devices storage devices 1221-12214 of FIG. 1 to detect a nodal failure.

The repairer 702 includes number of failures determination block 746 that determines a count of the number of nodal failures. That is, the repairer determines a number of unavailable packets among the set of k data packets 726a-726j and the set of r parity packets 728a-728d. In response to detecting an event of five of more nodal failures, the repairer 702 shuts down Nodes 1-14 (in block 748). In response to detecting an event including 2, 3, or 4 nodal failures, the repairer 702 implements a traditional repair function (in block 750), as described above.

The repairer 702 includes a failure type determination block 752 configured to determine the type of failure as either a failure of a node storing a data packet 726a-726j or a failure of a node storing a parity packet 728a-728d, in response to the determination by block 746 that an event of a single-node failure occurred.

The repairer 702 includes packet divider blocks 754 and 756 that each divide the packets into a number of groups based on the type of failure. Section 3.2 of the Appendix describes the process of dividing the nodes into group in greater detail. The packet divider blocks 754 divides the n packets 726a-726j and 728a-728d into five groups when one of the k data packets 726a-726j is unavailable. The packet divider blocks 756 divides the n packets 726a-726j and 728a-728d into three groups when one of the r parity packets 728a-728d is unavailable. The system 700 can store relationship information corresponding the group number i' with the identification of each packet and/or the identification of the corresponding storage device storing the packet.

The repairer 702 includes a group number determination block 758 that determines the group number i' of the unavailable data packet 726a-726j (w1-w10) or failed node. For example, when the data packet 726a (w1) is unavailable, such as when Node 1 or storage device 122i have failed, the group number determination block 758 identifies that the group number i'=1 includes the failed Node 1.

The repairer 702 includes a collector block 760 that obtains (for example, retrieves, or receives) collection data 762 (c1 through c14) from existing packets by connecting to available (i.e., non-failed) nodes through the third processing block 772. For example, when the data packet 726a (w1) is unavailable, the collector block 760 can retrieve the full 4 symbols from the existing data packets 726e-726i stored in available Nodes 5 and 9 that belong to the same group number i'=1 as the failed Node 1. Additionally, the collector block 760 can retrieve one symbol from the available Nodes 2-4, 6-8, and 10-14 that do not belong to the same group number i'=1 as the failed Node 1.

The repairer 702 includes a data packet generator block 764 that reconstructs or otherwise generates the failed data node by using the collection data received by the collector block 760 and the information provided from the encoder 701 through the second link 740. Section 3.3 of the Appendix provides additional details regarding the process for generating a reconstructed data node, such as Node 1' 530.

The repairer 702 includes another collector block 766 that obtains collection data 768 (c1 through c14) from existing packets by connecting to available nodes through the fourth processing block 774. The collector block 766 performs a similar function as the collector block 760. The collector block 766 is configured to obtain the full 4 symbols from each of Nodes 5-10, which belong to Group A. The collector block 766 is configured to obtain one symbol from each the remaining available nodes, which belong to Group C and Group D (together Group B).

The repairer 702 includes a parity packet generator block 770 that reconstructs or otherwise generates the failed parity node by using the collection data received by the collector block 766 and the information provided from the encoder 701 through the third link 742. Section 3.4 of the Appendix provides additional details regarding the process for generating a reconstructed parity node, such as Node 12' 540.

As shown in FIG. 7E, the repairer 702 includes the third processing block 772 and stores four dim-4 column vectors 776 (v1, v2, v3, v4). Section 3.1 of the Appendix provides additional details regarding the process for generating four dim-4 column vectors 776. The DSS controller can generate the four dim-4 column vectors 776 according to Equation 6 where $I_{n-k}$ is an (n–k)×(n–k) identity matrix.

$$\vec{v_1} = (\vec{v_1}, \vec{v_2}, \vec{v_3}, \vec{v_{n-k}}) = I_{n-k} \quad (6)$$

The third processing block 772 generates the collection data 762 (c1 through c14) and transfers the collection data 762 to the collector block 760. Note also that the collection data 762 includes each of the available constituent collection data (ci) 778a-778n, as described more particularly below. The operations of the third processing block 772 can be centralized in the DSS controller. The third processing block 772 includes k group number comparator 776 for each of the k data packets (W1-w10). The group number comparator 776 determines whether the corresponding data packet is in the group number i' identified by the group number determination block 758. If the data packet 726a (wi) is in the same group as the failed node, the third processing block 772 assigns the full four symbols of the packet wi to be the collection data (ci) 778a-778n. If the data packet wi is in a different group than group of the failed node, the third processing block 772 assigns the one symbol of the packet 726a (wi) to be the collection data (ci) 778a-778n in accordance with the product 780a (wivi') of the data packet 726a (wi) and one of the four dim-4 column vectors 776 having an index matching the group number i'.

Note that the third processing block 772 does not include a group number comparator 776 because the packet divider blocks 754 does not assign data packets the same group as parity packets. For each parity packet (w11-w14), the third processing block 772 assigns the full four symbols of the packet wi to be the collection data (ci) 778k-778n.

As shown in FIG. 7F, the repairer 702 includes a fourth processing block 774 that generates the collection data 768 (c1 through c14) and transfers the collection data 768 to the collector block 766. For each data packet (w5-w10) in Group A, the fourth processing block 774 assigns the full four symbols of the packet wi to be the collection data (ci) 782e-778j. For each data packet (w11-w14) in Group C, the fourth processing block 774 applies Equation 7 to determine the one symbol of data to be the collection data collection data (ci) 782a-782d. For each parity packet (w11-w14) in Group D, the fourth processing block 774 applies Equation 8 to determine the one symbol of data to be the collection data collection data (ci) 782k-782n. Section 3.4 of the Appendix provides additional details regarding a repair function for failed parity nodes.

$$c_i = w_{i-1} u_i \text{ where } i=1, \ldots, 4 \quad (7)$$

$$c_i = c_{10+i} u_i \text{ where } i=1, \ldots, 4 \quad (8)$$

Although FIGS. 7A-F show one example of an XF erasure code encoder and repair system 700, various changes can be made to FIGS. 7A-F. For example, the packet divider blocks 754 and 756 can be combined into a single packet divider block that performs the functions both. As another example, each of the n nodes can store or otherwise access the four dim-4 column vectors 776 (v1, v2, v3, v4), and the operations of the third processing block 772 are be distributed to the n storage devices/nodes (Nodes 1-14), enabling each node to self-determine the collection data (ci),In the third processing block 772. Similarly, the operations of the fourth processing block 774 of the repairer 702 can be either centralized in the DSS controller, or distributed to a respective one of the n nodes. Although the system 700 shows that the encoder 701 and repairer 702 can be implemented in the same device, such as the server 104, in other embodiments, the encoder 701 can be a separate encoder 800 as shown in FIGS. 8A and 8B, and the repairer 702 can be a separate repairer 900 as shown in FIG. 9.

Figure 8A:
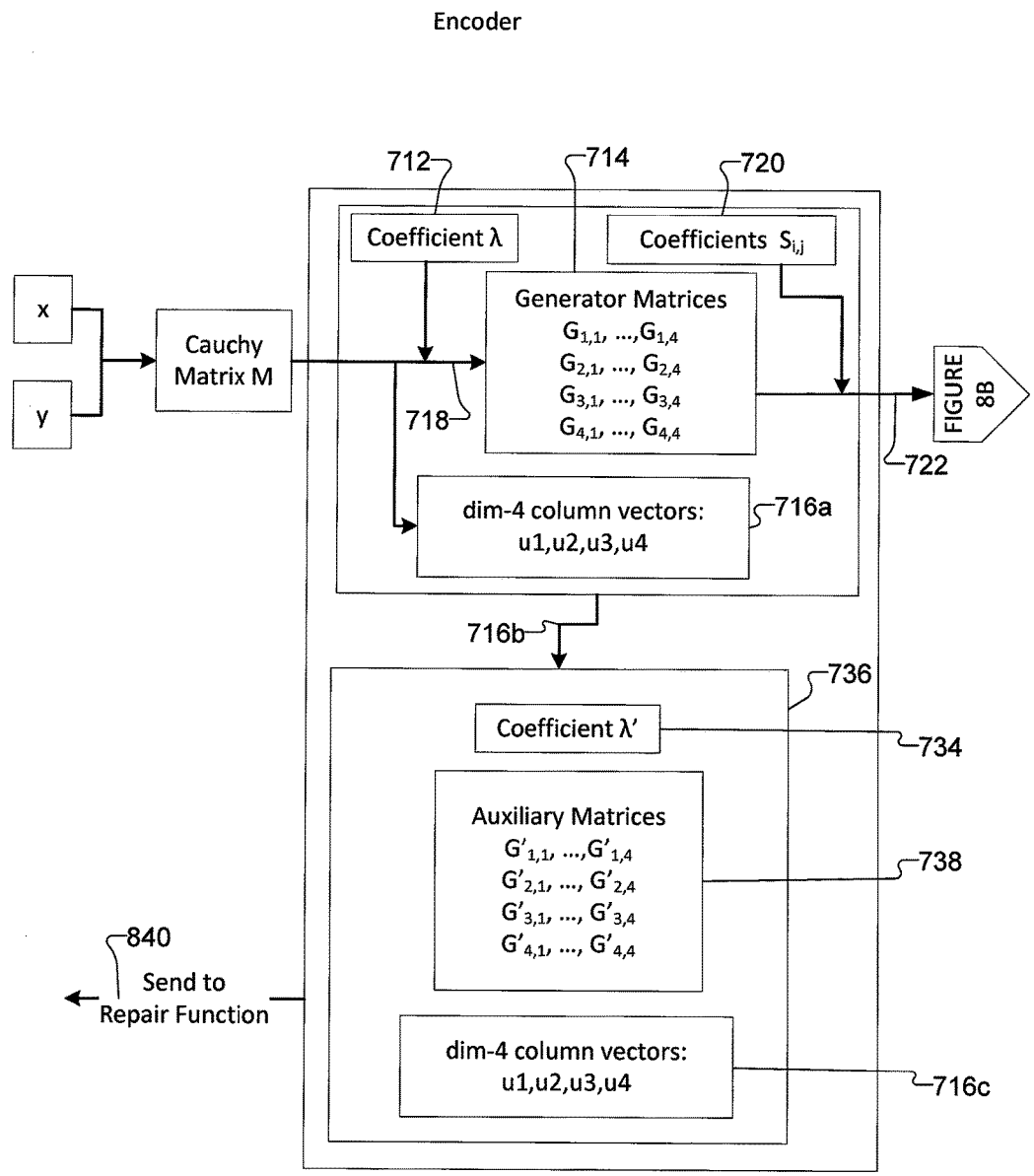
FIGS. 8A and 8B illustrate an example XF erasure code encoder according to this disclosure.
Figure 8B:
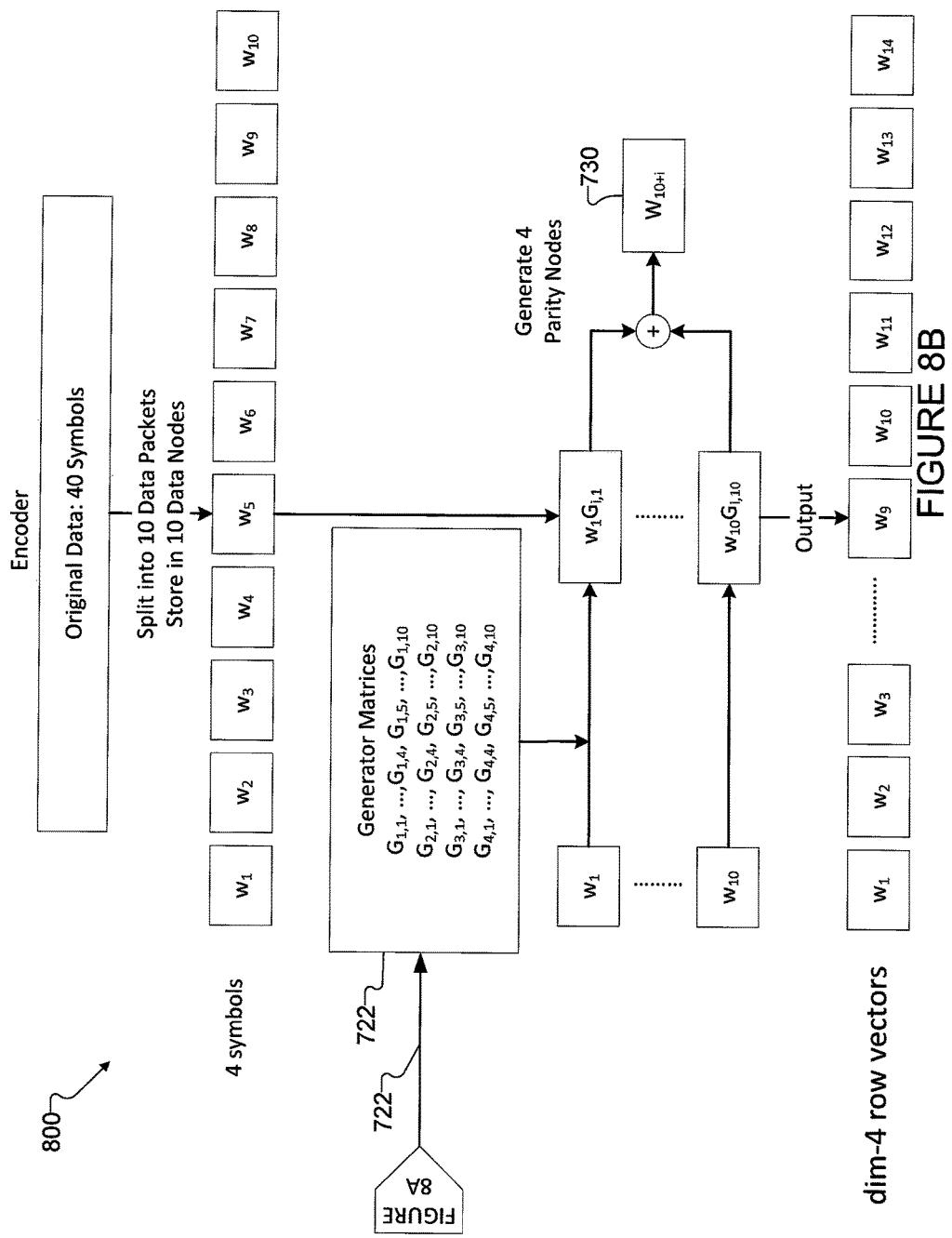
Figure 9:
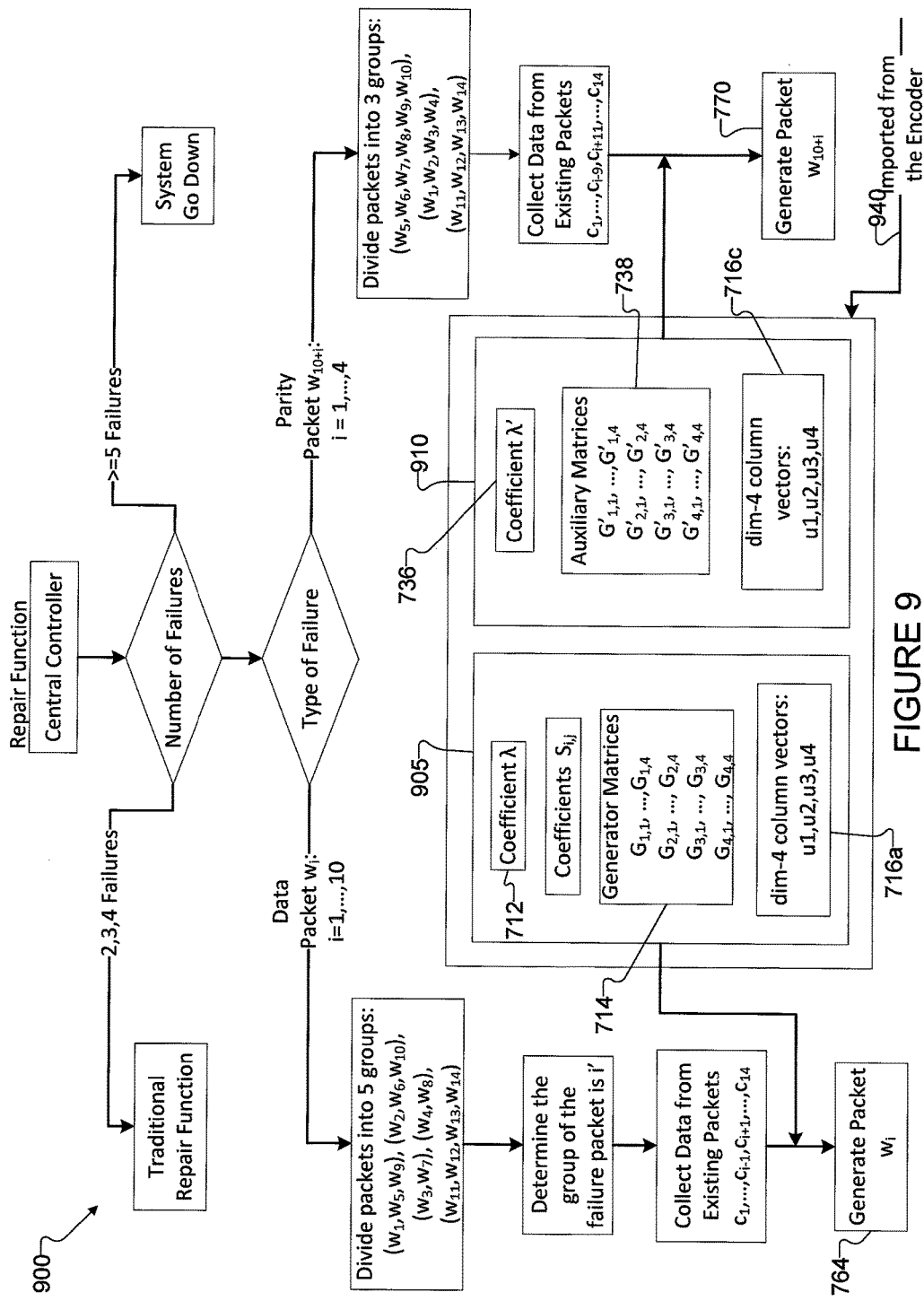
FIG. 9 illustrates an example XF erasure code repairer according to this disclosure.

FIGS. 8A and 8B illustrate an example XF erasure code encoder 800 according to this disclosure. The encoder 800 can be the same as or similar to the encoder 701 of FIGS. 7A-F, and can include various components of the encoder 701 that operate in a same or similar way as described above. Features common between the encoder 800 and the encoder 700 of FIGS. 7A-F will not be duplicated with reference to FIGS. 8A and 8B.

As shown in FIG. 8A, the encoder 800 includes a first processing block 810 that generates the complete generator matrix 722 using the first portion a generator matrix 714 and the $S_{i,j}$ coefficients 720. That is, the first processing block 810 stores the $S_{i,j}$ coefficients 720.

The encoder 800 includes a communication interface 840 that includes the second link 740 and the third link 742 of FIG. 7. The encoder 800 is configured to use the communication interface 840 to transmit information to a repairer, for example, the repairer 702 of FIGS. 7A-F or the repairer 900 of FIG. 9. As shown in FIG. 8B, the first processing block 810 generates the complete generator matrix 722, enabling the encoder 800 to generate the four individual parity packets 730.

FIG. 9 illustrates an example XF erasure code repairer 900 according to this disclosure. The repairer 900 can be the same as or similar to the repairer 702 of FIGS. 7A-F, and can include various components of the repairer 702 that operate in a same or similar way as described above. Features common between the repairer 900 and the repairer 702 of FIGS. 7A-F will not be duplicated with reference to FIG. 9.

As shown in FIG. 9, the repairer 900 includes a communication interface 940 that includes the second link 740 and the third link 742 of FIGS. 7A-F. The repairer 900 is configured to use the communication interface 940 to receive information from an encoder, for example, the encoder 701 of FIGS. 7A-F or the encoder 800 of FIGS. 8A and 8B. Similar to the second link 742.

The repairer 900 includes a storage 905 that upon receipt from an encoder, stores the coefficient 712, the $S_{i,j}$ coefficients 720, the first portion a generator matrix 714, and the four column vectors 716a (u1, u2, u3, u4) having a dimension dim-(n–k). The storage 905 uses the link 840 (similar to second link 740) to provide information stored therein to the data packet generator block 764 for reconstructing a failed data node.

The repairer 900 includes a storage 910 that upon receipt from an encoder, stores the λ' coefficient 736, the auxiliary generator matrix (G') 738, and n–k dim-4 column vectors 716c for decoding/reconstructing a node. The storage 910 uses the link 842 (similar to third link 742) to provide information stored therein to the parity packet generator block 770 for reconstructing a failed parity node.

Figure 10:
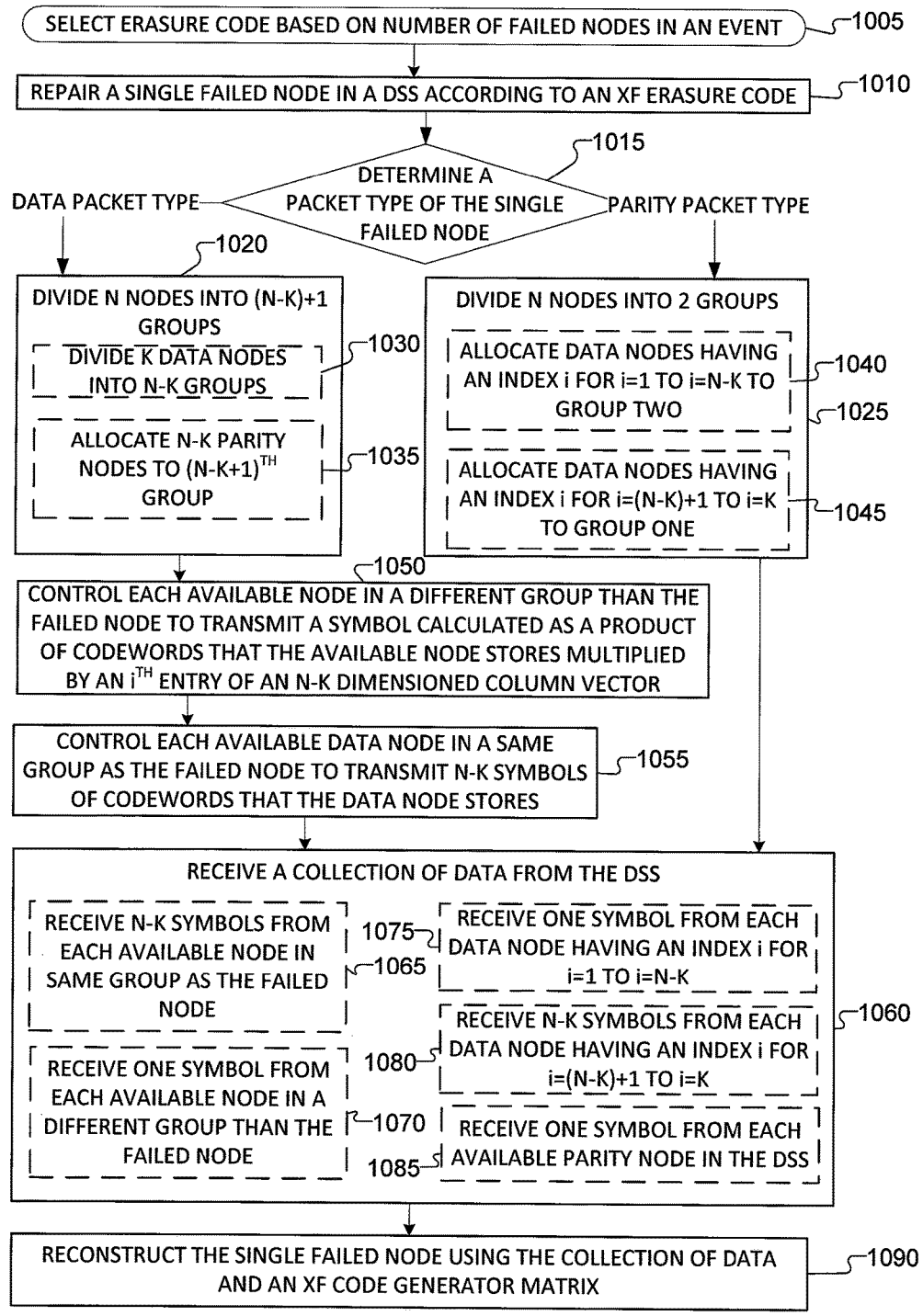
FIG. 10 illustrates a process of operating a DSS for reconstructing a failed node by implementing the XF erasure code according to this disclosure.

FIG. 10 illustrates a process 1000 of operating a DSS for reconstructing a failed node by implementing the XF erasure code according to this disclosure. The embodiment of the process 1000 of operating a DSS for reconstructing a failed node by implementing the XF erasure code shown in FIG. 10 is for illustration only. Other embodiments could be used without departing from the scope of this disclosure. The process 100 can be implemented in a DSS, such as the DSS 120 or DSS 500. The process 100 can be performed by a DSS controller, such as the DSS controller 505, the server 104 as DSS controller of the storage devices 122i-122n, processing circuitry within one or more of the storage devices 122i-122n, or the processing device 200. For simplicity, the process 1000 will be described as if implemented by the DSS 500.

In block 1005, in response to detecting an event of one or more failed nodes in the DSS 500, the DSS controller 505 selects an erasure code based on the number of failed nodes in the event. The DSS 500 includes n nodes composed of k data nodes and n−k parity nodes. Upon determining that the event includes a single failed node, the process 1000 proceeds to block 1010. In response to detecting that the event include a plurality of failed nodes including less than or equal to n−k nodal failures, the DSS controller 500 selects a traditional repair function such as the RS code, and thereby reconstructs the plurality of failed nodes from all symbols of k available nodes, wherein the k available nodes include: data nodes, parity nodes, or both data nodes and parity nodes.

In block 1010, upon determining that the event includes a single failed node, the DSS controller 505 selects to repair the single failed in the DSS 500 according to the XF erasure code. For example, if a data node fails, then the DSS controller 500 repairs the data node according to the XF erasure code applicable to repairing a data node. If a parity node fails, then the DSS controller 500 repairs the parity node according to the XF erasure code applicable to repairing a parity node.

In block 1015, the DSS controller 505 determines the type of packet stored by the single failed node. Upon determining that the single failed node stored a data packet (which indicates that the single failed node is a data node), the process 1000 proceeds to block 1020. Upon determining that the single failed node stored a parity packet (which indicates that the single failed node is a parity node), the process 1000 proceeds to block 1025.

In block 1020, the DSS controller 505 divides the N nodes of the DSS into a number of groups, namely (n−k)+1 groups. More particularly, in block 1030 the DSS controller 505 divides the k data nodes into n−k groups; and in block 1035, the DSS controller 505 allocates the n−k parity nodes to the (n−k+1)th group.

In block 1025, the DSS controller 505 divides the N nodes of the DSS 500 into a number of groups, namely two groups. More particularly, in block 1040, the DSS controller 505 allocates data nodes having an index for i=1 to i=n−k to one of the two groups, for example, Group B. In block 1045, the DSS controller 505 allocates data nodes having an index for i=(n−k)+1 to i=k to the other of the two groups, for example, Group A. Dividing the N nodes of the DSS 500 into a number of groups includes allocating the available parity nodes to a group, for example, Group B. As described above, the DSS controller 500 can divide the N nodes of the DSS 500 into three groups by allocating the n−k parity nodes to the third group, for example, Group D.

In block 1050, the DSS controller 505 controls each available node in a different group than the single failed node to transmit (to the DSS controller) a symbol calculated as a product of codewords that the available node stores multiplied by an ith entry of an n−k dimensioned column vector ($\vec{v}_i$). For example, if data Node 1 fails, the available nodes include the parity Nodes 11-14 in addition to the data Nodes 2-10. In the example wherein the single failed node is the data Node 1, the DSS controller determines that the failed Node 1 belongs to Group 1, determines that the available nodes in a different group are Nodes 2-4, 6-8, and 10-14.

In block 1055, the DSS controller 505 controls each available data node in a same group as the failed node to transmit (to the DSS controller) n−k symbols of codewords that the available data node stores. For example, if data Node 1 fails, the DSS controller determines that the failed Node 1 belongs to Group 1, determines that the available nodes in Group 1 include available data Nodes 5 and 9, and controls Nodes 5 and 9 to transmit n−k symbols.

In block 1060, the DSS controller 505 receives a collection of data from nodes of the DSS 500. More particularly, the DSS controller 505 receives a first collection of data when the determination of block 1015 is that single failed node is a data packet type. The DSS controller 505 receives a second collection of data when the determination of block 1015 is that single failed node is a parity packet type. In receiving the first collection of data, the DSS controller 505 receives n−k symbols from each available node in the same group as the failed node (block 1065); and receives one symbol from each available node in a different group than the failed node (block 1070). In receiving the second collection of data, the DSS controller 505 receives one symbol from each data node having an index i for i=1 to i=n−k (block 1075); receives n−k symbols from each data node having an index i for i=(n−k)+1 to i=k (block 1080); and receives one symbol from each available parity node in the DSS (block 1085). Note that the DSS controller 505 can receive the second collection of data by controlling the each of the data nodes of Group B to transmit a symbol calculated as the product of the codeword (wi) stored in the data node multiplied by an ith entry (ui) of an n−k dimensioned column vector 716c (u1, u2, u3, u4); controlling each of the data nodes of Group A to transmit n−k symbols of the codeword (wi) stored in the data node; and controlling each of the parity nodes in Group B/Group D to transmit a symbol (782k-782n).

In block 1090, the DS S controller 505 reconstructs the single failed node using the collection of data and an XF code generator matrix 714 or 738. For example, in reconstructing a data node, the DSS controller 505 generates the XF code generator matrix 714, or receives the XF code generator matrix 714 from an encoder, such as the encoder 800. For example, in reconstructing a parity node, the DSS controller 505 generates the auxiliary XF code generator matrix 738, or receives the auxiliary XF code generator matrix 7738 from an encoder, such as the encoder 800.

Although FIG. 10 illustrates one example process 1000 of operating a DSS for reconstructing a failed node by implementing the XF erasure code, various changes may be made to FIG. 10. For example, while shown as a series of steps, various steps in FIG. 10 could overlap, occur in parallel, occur in a different order, or occur any number of times.

None of the description in this application should be read as implying that any particular element, step, or function is an essential element that must be included in the claim scope. The scope of patented subject matter is defined only by the claims. Moreover, none of the claims is intended to invoke 35 U.S.C. § 112(f) unless the exact words "means for" are followed by a participle.

What is claimed is:

1. An apparatus comprising:
   a communication interface operably coupled to a distributed storage system (DSS) that includes n nodes encoded according to an XF erasure code, wherein the n nodes include k data nodes, n−k parity nodes, wherein each data node in the DSS stores a data packet and each parity node in the DSS stores a parity packet; and a processor coupled to the communication interface, the processor configured to detect and repair a single failed node in the DSS by:
  detecting an event of a nodal failure;
  dividing the n nodes into a number of groups based on a packet type of the single failed node;
  upon determining that the single failed node includes a data packet, receiving, from the DSS, a collection of data including:
    n−k symbols of the data packet from each available data node in a same group as the single failed node, and
    one symbol of the packet from each available node nodes in a different group than the single failed node; and
  reconstructing the single failed node using the collection of data and an XF code generator matrix.

2. The apparatus of claim 1, wherein the processor is further configured to:
  upon determining that the single failed node includes a parity packet, receive, from the DSS, a second collection of data including:
    n−k symbols of the data packet from each the data nodes having an index i for i=(n−k)+1 to i=k,
    one symbol from the parity packet stored in each available parity node in the DSS, and
    one symbol from the data packet stored in each of the data nodes having an index i for i=1 to i=n−k; and
  reconstruct the single failed node using the second collection of data and the XF code generator matrix.

3. The apparatus of claim 1, wherein the XF erasure code is a (14, 10) vector code.

4. The apparatus of claim 1, wherein the processor is further configured to divide the nodes into groups by:
  determining a number of groups based on the packet type of the single failed node;
  upon determining that the single failed node includes a data packet, dividing the k data nodes into n−k groups, and allocating the n−k parity nodes to an $(n-k+1)^{th}$ group.

5. The apparatus of claim 4, wherein the processor is further configured to:
  upon determining that the single failed node includes a parity packet, dividing the k data nodes into a two groups including:
    a first group comprising each the data nodes having an index i for i=(n−k)+1 to i=k and
    a second group comprising each of the data nodes having an index i for i=1 to i=n−k.

6. The apparatus of claim 1, wherein the processor is further configured to generate the collection data by:
  controlling each of the available nodes in a different group than the single failed node to transmit, to the processor, a symbol calculated as a product of codewords, that an available node stores, multiplied by an $i^{th}$ entry of an n−k dimensioned column vector ($\vec{v}_i$) where i' identifies a group number of the single failed node; and
  controlling each of the available data nodes in the same group as the single failed node to transmit, to the processor, n−k symbols of codewords that an the available node stores.

7. The apparatus of claim 1, wherein the processor is further configured to:
  in response to detecting an event including a plurality of failed nodes including less than or equal to n−k nodal failures reconstructing the plurality of failed nodes from all symbols of k available nodes, the k available nodes including: data nodes, parity nodes, or both data nodes and parity nodes.

8. A method comprising:
detecting and repairing, by a processor, a single failed node in a distributed storage system (DSS) that includes n nodes encoded according to an XF erasure code, wherein the n nodes include k data nodes, n−k parity nodes, wherein each data node in the DSS stores a data packet and each parity node in the DSS stores a parity packet, by:
  detecting an event of a nodal failure;
  dividing the n nodes into a number of groups based on a packet type of the single failed node;
  upon determining that the single failed node includes a data packet, receiving, from the DSS, a collection of data including:
    n−k symbols of the data packet from each available data node in a same group as the single failed node, and
    one symbol of the packet from each available node in a different group than the single failed node; and
  reconstructing the single failed node using the collection of data and an XF code generator matrix.

9. The method of claim 8, further comprising:
upon determining that the single failed node includes a parity packet, receiving, from the DSS, a second collection of data including:
  n−k symbols of the data packet from each the data nodes having an index i for i=(n−k)+1 to i=k,
  one symbol from the parity packet stored in each available parity node in the DSS, and
  one symbol from the data packet stored in each of the data nodes having an index i for i=1 to i=n−k; and
reconstruct the single failed node using the second collection of data and the XF code generator matrix.

10. The method of claim 8, wherein the XF erasure code is a (14, 10) vector code.

11. The method of claim 8, wherein dividing the nodes into groups further comprises:
  determining a number of groups based on the packet type of the single failed node;
  upon determining that the single failed node includes a data packet, dividing the k data nodes into n−k groups, and allocating the n−k parity nodes to an $(n-k+1)^{th}$ group.

12. The method of claim 11, further comprising:
upon determining that the single failed node includes a parity packet, dividing the k data nodes into a two groups including:
  a first group comprising each the data nodes having an index i for i=(n−k)+1 to i=k and
  a second group comprising each of the data nodes having an index i for i=1 to i=n−k.

13. The method of claim 8, wherein generating the collection data comprises:
  controlling each of the available nodes in a different group than the single failed node to transmit, to the processor, a symbol calculated as a product of codewords that the available node stores multiplied by an $i^{th}$ entry of an n−k dimensioned column vector ($\vec{v}_i$) where i' identifies a group number of the single failed node; and controlling each of the available data nodes in the same group as the single failed node to transmit, to the processor, n−k symbols of codewords that an the available node stores.

14. The method of claim 8, further comprising:
in response to detecting an event including a plurality of failed nodes including less than or equal to n−k nodal failures, reconstructing the plurality of failed nodes from all symbols of k available nodes, the k available nodes including: data nodes, parity nodes, or both data nodes and parity nodes.

15. An encoding apparatus comprising:
a communication interface operably coupled to a distributed storage system (DSS) that includes n storage device nodes;
a processor coupled to the communication interface, the processor configured to encode the n nodes according to an XF erasure code to detect and repair a nodal failure of the DSS by:
dividing a number of symbols of original data into k data packets;
selecting k of the storage device nodes to store the k data packets and n−k other storage device nodes to store parity packets;
outputting the k data packets to the k selected storage device nodes;
obtaining an XF code generator matrix;
generating n−k parity packets according to a function of the k data packets and the XF code generator matrix; and
outputting the n−k parity packets to each of the n−k other storage device nodes.

16. The encoding apparatus of claim 15, wherein the processor is further configured to:
receive the number of symbols of original data;
divide the symbols of original data into k data packets, such that each data packet includes (n−k) symbols.

17. The encoding apparatus of claim 15, wherein the processor is further configured to obtain the XF code generator matrix by: generating the XF code generator matrix.

18. The encoding apparatus of claim 15, wherein the processor is further configured to obtain the XF code generator matrix by: receiving the XF code generator matrix.

19. The encoding apparatus of claim 15, wherein the processor is further configured to generate the n−k parity packets according to the function of the k data packets and the XF code generator matrix by:
generating each $i^{th}$ individual parity packet for i=1, . . . , n−k, by:
multiplying each of the k data packets by each element of j columns (j =1, 2, . . . j=k) in an $i_{th}$ row of the XF code generator matrix, thereby obtaining j products;
generating the $i^{th}$ individual parity packet by summing the j products.

20. The encoding apparatus of claim 15, wherein the XF erasure code is a (14, 10) vector code.

* * * * *